(12) United States Patent
Lau et al.

(10) Patent No.: US 9,316,346 B2
(45) Date of Patent: Apr. 19, 2016

(54) SUPPORT SYSTEM

(75) Inventors: Alex Lau, London (GB); Andrew Wills, London (GB)

(73) Assignee: Colebrook Bosson Saunders (Products) Limited, London (GB)

( * ) Notice: Subject to any disclaimer, the term of this patent is extended or adjusted under 35 U.S.C. 154(b) by 650 days.

(21) Appl. No.: 13/024,685

(22) Filed: Feb. 10, 2011

(65) Prior Publication Data

US 2011/0303805 A1    Dec. 15, 2011

(30) Foreign Application Priority Data

| Jun. 9, 2010 | (GB) | ................................ GB1009680.8 |
| Aug. 11, 2010 | (EM) | .......................... 001742438-0001 |
| Aug. 11, 2010 | (EM) | .......................... 001742438-0002 |
| Aug. 11, 2010 | (EM) | .......................... 001742438-0003 |
| Aug. 11, 2010 | (EM) | .......................... 001742438-0004 |
| Aug. 11, 2010 | (EM) | .......................... 001742438-0005 |

(51) Int. Cl.
  *F16M 13/02* (2006.01)
  *F16M 11/12* (2006.01)
  *F16M 11/20* (2006.01)

(52) U.S. Cl.
  CPC ............ *F16M 13/02* (2013.01); *F16M 11/126* (2013.01); *F16M 11/2064* (2013.01); *F16M 13/022* (2013.01); *F16M 2200/022* (2013.01); *F16M 2200/041* (2013.01); *F16M 2200/044* (2013.01)

(58) Field of Classification Search
  CPC ....... F16M 11/02; F16M 11/04; F16M 11/08; F16M 11/10; F16M 11/12; F16M 2200/044; F16M 2200/04; F16M 2200/041; F16M 2200/065; F16M 2200/068; F16M 2200/063; F16M 11/2092; F16M 11/2085; F16M 13/02; F16M 13/022; F16M 11/126; F16M 11/2064

USPC ........ 248/125.8–125.9, 123.11, 280.11, 121, 248/292.11, 276.1, 278.1, 284.1, 183.3, 248/299.1, 292.14, 371, 578, 176.3, 923, 248/279.1, 176.1; 267/69–74; 108/8, 136

See application file for complete search history.

(56) References Cited

U.S. PATENT DOCUMENTS

| 406,534 | A | * | 7/1889 | Perkins ......................... 248/480 |
| 1,078,577 | A | | 11/1913 | Fox |

(Continued)

FOREIGN PATENT DOCUMENTS

| CZ | 1666 U1 | 5/1994 |
| DE | 10013445 A1 | 10/2000 |

(Continued)

OTHER PUBLICATIONS

DPG, Cygnus Gas Lift Arm (Silver) up to 10kg, 1 page.

(Continued)

*Primary Examiner* — Ingrid M Weinhold

(74) *Attorney, Agent, or Firm* — Michael Best & Friedrich LLP

(57) ABSTRACT

A mounting system for pivotally mounting a load such as display device to a support arm including a device mounting element for supporting a display, a hoop element defined by a portion of the circumference of a circle, and a support arm mount slidable along relative to, and rotatable about relative to, the hoop. A support system for supporting a load such as a display device includes a mount for a load, a base element and a support arm coupling the mount and base element at, respectively, distal and proximal portions of the support arm, and pivotally connected to at least the base element. A support arm for supporting a load such as a display device includes a balancing mechanism providing a force or torque operative to balance the weight of a display device on or near a first end of the support arm, an adjustment mechanism to adjust the magnitude of the force or torque provided by the balancing mechanism, and an indicator arrangement on the support arm for providing a visual indication of the magnitude of force or torque provided by the balancing mechanism.

20 Claims, 17 Drawing Sheets

(56) References Cited

U.S. PATENT DOCUMENTS

| | | | |
|---|---|---|---|
| 1,389,700 A * | 9/1921 | Rodow | 248/444 |
| 1,719,190 A * | 7/1929 | Morgan | 248/445 |
| 1,863,163 A * | 6/1932 | Malti et al. | 248/102 |
| 2,562,979 A | 8/1951 | Yingling | |
| 2,986,366 A | 5/1961 | Wesson | |
| D192,920 S | 5/1962 | Beals | |
| 3,199,824 A | 8/1965 | Chapps | |
| 3,291,432 A | 12/1966 | Lucasey | |
| 3,311,340 A | 3/1967 | Riis | |
| 3,358,957 A | 12/1967 | Lindenmuth | |
| D211,023 S | 5/1968 | Grossman | |
| 3,462,112 A | 8/1969 | Vom Brack et al. | |
| 3,559,942 A | 2/1971 | Lucasey | |
| 3,574,340 A * | 4/1971 | Busche | 248/285.1 |
| 3,662,981 A | 5/1972 | Hogrebe | |
| 3,774,873 A | 11/1973 | Krogsrud | |
| 3,784,135 A | 1/1974 | Owen, Jr. | |
| 3,813,491 A | 5/1974 | Pennar | |
| 3,856,251 A | 12/1974 | Miller | |
| 3,889,910 A | 6/1975 | Walters | |
| 3,950,086 A | 4/1976 | Schulman et al. | |
| 3,981,340 A | 9/1976 | Anderson et al. | |
| 4,025,017 A | 5/1977 | Miller | |
| 4,082,244 A * | 4/1978 | Groff | 248/280.11 |
| 4,160,536 A | 7/1979 | Krogsrud | |
| 4,226,390 A | 10/1980 | Steggall | |
| 4,298,893 A | 11/1981 | Holmes | |
| 4,310,136 A | 1/1982 | Mooney | |
| 4,366,741 A | 1/1983 | Titus | |
| 4,437,638 A | 3/1984 | Scheibenpflug | |
| 4,438,458 A | 3/1984 | Munscher | |
| 4,447,031 A | 5/1984 | Souder, Jr. et al. | |
| D275,284 S | 8/1984 | Wells et al. | |
| 4,487,389 A | 12/1984 | Ziegler | |
| 4,516,751 A | 5/1985 | Westbrook | |
| 4,546,708 A | 10/1985 | Wilburth | |
| D281,502 S | 11/1985 | Wheeler | |
| 4,562,987 A | 1/1986 | Leeds et al. | |
| 4,565,343 A | 1/1986 | Lake, Jr. et al. | |
| 4,566,663 A | 1/1986 | Barchus | |
| 4,570,892 A * | 2/1986 | Czech et al. | 248/372.1 |
| 4,616,218 A | 10/1986 | Bailey et al. | |
| 4,620,808 A | 11/1986 | Kurtin et al. | |
| 4,638,969 A | 1/1987 | Brown | |
| 4,669,694 A | 6/1987 | Malick | |
| 4,682,749 A | 7/1987 | Strater | |
| 4,687,167 A | 8/1987 | Skalka et al. | |
| 4,691,886 A | 9/1987 | Wendling et al. | |
| 4,703,909 A | 11/1987 | Dayton et al. | |
| 4,708,312 A * | 11/1987 | Rohr | 248/281.11 |
| 4,725,106 A | 2/1988 | Shields et al. | |
| 4,729,533 A | 3/1988 | Hillary et al. | |
| 4,735,467 A | 4/1988 | Wolters | |
| 4,762,378 A | 8/1988 | Kagami | |
| 4,768,744 A | 9/1988 | Leeds et al. | |
| 4,779,922 A | 10/1988 | Cooper | |
| 4,783,036 A | 11/1988 | Vossoughi | |
| 4,817,903 A | 4/1989 | Braehler et al. | |
| 4,834,329 A | 5/1989 | Delapp | |
| 4,836,486 A | 6/1989 | Vossoughi et al. | |
| 4,844,387 A | 7/1989 | Sorgi et al. | |
| 4,852,500 A | 8/1989 | Ryburg et al. | |
| 4,863,140 A | 9/1989 | Schriner | |
| 4,880,270 A | 11/1989 | Cooper | |
| 4,915,450 A | 4/1990 | Cooper | |
| 4,944,481 A | 7/1990 | Yurchenco et al. | |
| 4,953,822 A * | 9/1990 | Sharber et al. | 248/281.11 |
| 4,964,606 A | 10/1990 | Beam et al. | |
| 4,986,501 A | 1/1991 | Simon | |
| 4,989,813 A | 2/1991 | Kim et al. | |
| 4,993,676 A | 2/1991 | Fitts et al. | |
| 5,000,608 A | 3/1991 | Schmidt | |
| 5,007,608 A | 4/1991 | Carroll, Jr. | |
| 5,039,044 A | 8/1991 | Sher | |
| 5,064,161 A | 11/1991 | Anderson | |
| 5,086,476 A | 2/1992 | Bacus | |
| 5,088,676 A | 2/1992 | Orchard et al. | |
| 5,092,552 A | 3/1992 | Dayton et al. | |
| 5,108,063 A | 4/1992 | Koerber, Sr. et al. | |
| 5,122,941 A | 6/1992 | Gross et al. | |
| 5,125,610 A | 6/1992 | Queau | |
| 5,127,617 A | 7/1992 | Bergetz | |
| 5,139,223 A | 8/1992 | Sedighzadeh | |
| 5,165,644 A | 11/1992 | Allen | |
| 5,177,616 A | 1/1993 | Riday | |
| 5,179,447 A | 1/1993 | Lain | |
| 5,187,641 A | 2/1993 | Muskatello et al. | |
| 5,195,709 A | 3/1993 | Yasushi | |
| D337,333 S | 7/1993 | Turk | |
| D340,235 S | 10/1993 | Robak et al. | |
| 5,340,072 A | 8/1994 | Halbirt | |
| 5,348,260 A | 9/1994 | Acevedo | |
| 5,374,104 A | 12/1994 | Moore et al. | |
| 5,501,420 A | 3/1996 | Watt et al. | |
| 5,537,290 A | 7/1996 | Brown et al. | |
| 5,646,818 A | 7/1997 | Hahn | |
| 5,667,179 A | 9/1997 | Rosen | |
| 5,673,170 A | 9/1997 | Register | |
| 5,687,939 A | 11/1997 | Moscovitch | |
| 5,791,609 A * | 8/1998 | Hankins | 248/124.1 |
| 5,805,415 A | 9/1998 | Tran et al. | |
| 5,826,846 A | 10/1998 | Buccieri et al. | |
| 5,842,672 A | 12/1998 | Sweere et al. | |
| 5,884,880 A | 3/1999 | Rice | |
| 5,904,328 A | 5/1999 | Leveridge et al. | |
| 5,975,472 A | 11/1999 | Hung | |
| 5,992,809 A | 11/1999 | Sweere et al. | |
| 6,012,693 A | 1/2000 | Voeller et al. | |
| 6,015,120 A | 1/2000 | Sweere et al. | |
| 6,061,104 A | 5/2000 | Evanicky et al. | |
| 6,062,148 A | 5/2000 | Hodge et al. | |
| 6,126,128 A | 10/2000 | Costa et al. | |
| 6,134,103 A | 10/2000 | Ghanma | |
| RE36,978 E | 12/2000 | Moscovitch | |
| 6,164,612 A | 12/2000 | Schmitt | |
| D435,852 S | 1/2001 | Oddsen, Jr. | |
| 6,173,933 B1 | 1/2001 | Whiteside et al. | |
| 6,179,263 B1 | 1/2001 | Rosen et al. | |
| 6,186,459 B1 | 2/2001 | Ma | |
| 6,189,842 B1 | 2/2001 | Bergeron Gull et al. | |
| 6,216,989 B1 | 4/2001 | Shioya et al. | |
| 6,261,023 B1 | 7/2001 | Schmitt et al. | |
| 6,394,403 B1 | 5/2002 | Hung | |
| 6,398,172 B1 | 6/2002 | Rousek et al. | |
| 6,418,010 B1 | 7/2002 | Sawyer | |
| 6,419,196 B1 | 7/2002 | Sweere et al. | |
| 6,431,511 B1 | 8/2002 | Pfister | |
| 6,464,185 B1 | 10/2002 | Minelli et al. | |
| 6,476,884 B1 | 11/2002 | Shao | |
| 6,478,275 B1 | 11/2002 | Huang | |
| 6,481,688 B1 | 11/2002 | Welling et al. | |
| 6,484,994 B2 | 11/2002 | Hokugoh | |
| 6,517,040 B1 | 2/2003 | Wen | |
| 6,543,734 B2 | 4/2003 | Yeh | |
| 6,554,238 B1 | 4/2003 | Hibberd | |
| 6,575,419 B1 | 6/2003 | Masuda et al. | |
| D477,606 S | 7/2003 | Theis et al. | |
| 6,585,201 B1 | 7/2003 | Reed | |
| 6,604,722 B1 | 8/2003 | Tan | |
| 6,655,645 B1 | 12/2003 | Lu et al. | |
| 6,672,553 B1 | 1/2004 | Lin | |
| 6,676,098 B2 | 1/2004 | Lin | |
| 6,688,572 B2 | 2/2004 | Huang et al. | |
| 6,695,270 B1 | 2/2004 | Smed | |
| 6,712,321 B1 | 3/2004 | Su et al. | |
| 6,758,454 B2 | 7/2004 | Smed | |
| 6,766,994 B2 | 7/2004 | Serbinski et al. | |
| D494,183 S | 8/2004 | Wills et al. | |
| 6,769,657 B1 | 8/2004 | Huang | |
| 6,796,537 B1 | 9/2004 | Lin | |
| 6,796,541 B2 | 9/2004 | Lu | |
| 6,857,610 B1 | 2/2005 | Conner et al. | |
| 6,863,252 B2 | 3/2005 | Bosson | |
| 6,874,743 B2 | 4/2005 | Watanabe et al. | |

(56) References Cited

U.S. PATENT DOCUMENTS

| | | |
|---|---|---|
| 6,892,650 B2 | 5/2005 | Baloga et al. |
| 6,896,230 B2 | 5/2005 | Cvek |
| 6,905,101 B1 | 6/2005 | Dittmer |
| 6,912,120 B2 | 6/2005 | Kim et al. |
| 6,947,211 B2 | 9/2005 | Metelski |
| 6,961,234 B2 | 11/2005 | Tanaka et al. |
| 6,962,312 B2 | 11/2005 | Shih |
| 6,987,666 B2 | 1/2006 | Medica et al. |
| D518,063 S | 3/2006 | Piazza et al. |
| 7,028,961 B1 | 4/2006 | Dittmer et al. |
| D520,017 S | 5/2006 | van Kuijk et al. |
| D522,009 S | 5/2006 | Chen |
| D522,010 S | 5/2006 | Piazza et al. |
| 7,061,754 B2 | 6/2006 | Moscovitch |
| D529,033 S | 9/2006 | Hung |
| 7,104,511 B2 | 9/2006 | Smith et al. |
| 7,114,688 B2 | 10/2006 | Rudolf |
| 7,124,989 B1 | 10/2006 | Lee et al. |
| 7,143,478 B2 | 12/2006 | Quijano |
| 7,145,767 B2 | 12/2006 | Mache et al. |
| 7,150,440 B2 | 12/2006 | Yuan |
| 7,152,836 B2 | 12/2006 | Pfister et al. |
| D537,323 S | 2/2007 | Saez |
| 7,178,774 B2 | 2/2007 | Kim |
| 7,198,237 B2 | 4/2007 | Cho et al. |
| 7,198,240 B2 | 4/2007 | Chen |
| 7,207,537 B2 | 4/2007 | Hung |
| 7,215,538 B1 | 5/2007 | Chen et al. |
| D544,489 S | 6/2007 | Oddsen et al. |
| 7,227,598 B2 | 6/2007 | Chin |
| 7,233,344 B2 | 6/2007 | Leichter |
| 7,243,892 B2 | 7/2007 | Pfister |
| 7,246,780 B2 | 7/2007 | Oddsen, Jr. |
| 7,252,277 B2 | 8/2007 | Sweere et al. |
| 7,258,311 B2 | 8/2007 | Yen et al. |
| 7,261,266 B2 | 8/2007 | Satterfield |
| 7,264,212 B2 | 9/2007 | Hung |
| 7,267,312 B2 | 9/2007 | Kang et al. |
| D553,135 S | 10/2007 | Muday et al. |
| 7,289,315 B2 | 10/2007 | Hillman et al. |
| D556,205 S | 11/2007 | Wohlford et al. |
| 7,316,377 B2 | 1/2008 | Smed |
| D562,114 S | 2/2008 | Chiu et al. |
| 7,331,551 B2 | 2/2008 | Oddsen, Jr. |
| D563,399 S | 3/2008 | Wohlford et al. |
| 7,338,022 B2 | 3/2008 | Hung |
| 7,345,870 B2 | 3/2008 | Shin |
| D566,531 S | 4/2008 | Massoumi et al. |
| 7,361,046 B2 | 4/2008 | Drew |
| 7,364,127 B2 | 4/2008 | Huang |
| D568,135 S | 5/2008 | Pribyl et al. |
| D568,325 S | 5/2008 | Muday et al. |
| D570,853 S | 6/2008 | Derry et al. |
| 7,380,760 B2 | 6/2008 | Dittmer |
| 7,384,019 B2 | 6/2008 | Choi |
| 7,387,286 B2 | 6/2008 | Dittmer et al. |
| 7,395,995 B2 | 7/2008 | Chen |
| 7,395,996 B2 | 7/2008 | Dittmer |
| 7,396,233 B2 | 7/2008 | Lin |
| 7,399,033 B2 | 7/2008 | Hsiao |
| 7,404,535 B2 | 7/2008 | Mossman et al. |
| 7,410,138 B2 | 8/2008 | Parsons |
| 7,413,152 B1 | 8/2008 | Chen |
| D577,731 S | 9/2008 | Altonji et al. |
| 7,424,991 B2 | 9/2008 | Kim et al. |
| 7,424,994 B2 | 9/2008 | Jeong |
| 7,434,774 B1 | 10/2008 | Floersch et al. |
| 7,438,269 B2 | 10/2008 | Pfister et al. |
| 7,441,981 B2 * | 10/2008 | Crain et al. .................. 403/321 |
| 7,448,584 B2 | 11/2008 | Chen et al. |
| 7,460,186 B2 | 12/2008 | Isobe et al. |
| 7,467,773 B2 | 12/2008 | Ogawa et al. |
| D584,734 S | 1/2009 | Chu |
| 7,487,943 B1 | 2/2009 | Gillespie |
| 7,490,796 B2 | 2/2009 | Kim |
| 7,494,104 B2 | 2/2009 | Baek |
| 7,497,408 B2 | 3/2009 | Lim et al. |
| 7,503,538 B2 | 3/2009 | Liou et al. |
| 7,510,154 B2 | 3/2009 | Oddsen, Jr. et al. |
| 7,510,155 B2 | 3/2009 | Huang et al. |
| 7,510,241 B2 | 3/2009 | Nathan et al. |
| 7,513,469 B1 | 4/2009 | Ciungan |
| 7,515,402 B2 | 4/2009 | Tsuo |
| 7,516,924 B2 | 4/2009 | White et al. |
| 7,516,925 B2 | 4/2009 | Sawai et al. |
| 7,520,480 B2 | 4/2009 | Lee |
| 7,529,083 B2 | 5/2009 | Jeong |
| 7,537,189 B2 | 5/2009 | Jung et al. |
| D596,188 S | 7/2009 | Lau et al. |
| 7,564,682 B2 | 7/2009 | Liou et al. |
| D598,917 S | 8/2009 | Luber |
| 7,573,711 B2 | 8/2009 | Kim et al. |
| 7,575,265 B2 | 8/2009 | Vitito |
| 7,578,490 B2 | 8/2009 | Kim |
| 7,593,218 B2 | 9/2009 | Hwang et al. |
| 7,593,219 B2 | 9/2009 | Quijano et al. |
| 7,600,728 B2 | 10/2009 | Petrick et al. |
| 7,604,210 B2 | 10/2009 | Oddsen, Jr. et al. |
| 7,607,620 B2 | 10/2009 | Ozolins et al. |
| 7,621,500 B2 | 11/2009 | Ishizaki et al. |
| 7,623,342 B2 | 11/2009 | Ozolins et al. |
| 7,628,361 B2 | 12/2009 | Gan et al. |
| 7,630,193 B2 | 12/2009 | Ledbetter et al. |
| 7,636,133 B1 | 12/2009 | Hsu |
| 7,643,276 B2 | 1/2010 | Shin |
| 7,644,898 B2 | 1/2010 | White et al. |
| 7,645,870 B2 | 1/2010 | Khvorova et al. |
| 7,648,112 B2 | 1/2010 | Wu et al. |
| 7,651,058 B2 | 1/2010 | Cho et al. |
| 7,661,642 B2 | 2/2010 | Oh et al. |
| 7,661,643 B2 | 2/2010 | Oh |
| 7,663,699 B2 | 2/2010 | Sakata et al. |
| 7,669,808 B2 | 3/2010 | Lai et al. |
| 7,694,927 B2 | 4/2010 | Chuang |
| 7,703,733 B2 | 4/2010 | Price et al. |
| D631,052 S | 1/2011 | Hung |
| RE42,581 E | 8/2011 | Carnevali |
| D645,868 S | 9/2011 | Lau et al. |
| 8,066,232 B2 | 11/2011 | Wills et al. |
| D654,503 S | 2/2012 | Sapper |
| D660,845 S | 5/2012 | Schmauch et al. |
| D668,256 S | 10/2012 | Matteo |
| D670,554 S | 11/2012 | Bowman et al. |
| D675,905 S | 2/2013 | Bowman et al. |
| 8,366,060 B2 | 2/2013 | Hung |
| 8,708,298 B2 | 4/2014 | Hu et al. |
| 8,827,227 B2 | 9/2014 | Nagaoka et al. |
| 2002/0162921 A1 | 11/2002 | Rotondi |
| 2003/0075653 A1 | 4/2003 | Li |
| 2004/0011932 A1 | 1/2004 | Duff |
| 2004/0011938 A1 | 1/2004 | Oddsen, Jr. |
| 2004/0188578 A1 | 9/2004 | Turner |
| 2004/0189890 A1 | 9/2004 | Yen et al. |
| 2004/0195471 A1 | 10/2004 | Sachen, Jr. |
| 2004/0245419 A1 | 12/2004 | Sweere et al. |
| 2004/0262474 A1 | 12/2004 | Boks et al. |
| 2005/0001122 A1 | 1/2005 | Chen |
| 2005/0035252 A1 | 2/2005 | Chen |
| 2005/0205734 A1 | 9/2005 | Wang |
| 2005/0252336 A1 | 11/2005 | Coral et al. |
| 2006/0060735 A1 | 3/2006 | Oddsen, et al. |
| 2006/0084913 A1 | 4/2006 | Lo |
| 2006/0157627 A1 | 7/2006 | Hung |
| 2006/0175499 A1 | 8/2006 | Price et al. |
| 2006/0186295 A1 | 8/2006 | Dittmer et al. |
| 2006/0187625 A1 | 8/2006 | Jung et al. |
| 2006/0219849 A1 | 10/2006 | Chiu |
| 2006/0226326 A1 | 10/2006 | Asamarai et al. |
| 2006/0238967 A1 | 10/2006 | Carson et al. |
| 2006/0266903 A1 | 11/2006 | Oddsen, Jr. et al. |
| 2006/0274487 A1 | 12/2006 | Wang et al. |
| 2006/0291151 A1 | 12/2006 | Chen |
| 2007/0102596 A1 | 5/2007 | Sung |
| 2007/0125914 A1 | 6/2007 | Liou et al. |

(56) References Cited

U.S. PATENT DOCUMENTS

| | | | |
|---|---|---|---|
| 2007/0139870 A1 | 6/2007 | Lin | |
| 2007/0181755 A1 | 8/2007 | Oh et al. | |
| 2007/0181762 A1 | 8/2007 | Dittmer | |
| 2007/0194196 A1 | 8/2007 | Pfister et al. | |
| 2007/0205340 A1 | 9/2007 | Jung | |
| 2007/0262215 A1 | 11/2007 | Tan | |
| 2008/0023599 A1 | 1/2008 | Lin | |
| 2008/0029661 A1 | 2/2008 | Chen | |
| 2008/0029669 A1 | 2/2008 | Olah et al. | |
| 2008/0054133 A1 | 3/2008 | Huang | |
| 2008/0100996 A1 | 5/2008 | Wang | |
| 2008/0116318 A1 | 5/2008 | Wesley et al. | |
| 2008/0156953 A1 | 7/2008 | Oh et al. | |
| 2008/0164395 A1 | 7/2008 | Chang et al. | |
| 2009/0008518 A1 | 1/2009 | Shen | |
| 2009/0020673 A1 | 1/2009 | Dittmer | |
| 2009/0050760 A1 | 2/2009 | Duff | |
| 2009/0084913 A1 | 4/2009 | Grabania et al. | |
| 2009/0090831 A1 | 4/2009 | Henning et al. | |
| 2009/0146024 A1 | 6/2009 | Duan | |
| 2009/0166501 A1 | 7/2009 | Wang et al. | |
| 2009/0212184 A1 | 8/2009 | Bourgeois et al. | |
| 2009/0224122 A1 | 9/2009 | Liao | |
| 2009/0308990 A1 | 12/2009 | Yen et al. | |
| 2010/0001563 A1 | 1/2010 | Baru | |
| 2010/0148020 A1 | 6/2010 | Wills et al. | |
| 2010/0214469 A1 | 8/2010 | Duncan | |
| 2010/0327129 A1 | 12/2010 | Chen | |
| 2012/0267497 A1 | 10/2012 | Bowman et al. | |
| 2012/0292463 A1 | 11/2012 | Burns | |
| 2013/0314890 A1* | 11/2013 | Smith | 361/825 |

FOREIGN PATENT DOCUMENTS

| | | | |
|---|---|---|---|
| DE | 202006010262 U1 | 6/2006 | |
| EP | 1471300 A2 | 10/2004 | |
| EP | 1471300 A3 | 4/2005 | |
| EP | 1895225 A1 | 3/2008 | |
| GB | 2366083 A | 2/2002 | |
| GB | 2438581 A | 12/2007 | |
| GB | 2447623 A | 9/2008 | |
| TW | M368005 U | 11/2009 | |
| WO | WO 2007/137905 A1 | 12/2007 | |
| WO | WO 2008/092457 A1 | 8/2008 | |
| WO | WO 2008/098378 A1 | 8/2008 | |

OTHER PUBLICATIONS

Ergotron, 45-241-026 LX Desk Mount LCD Arm, 3 pages.
Ergotron, 45-214-026 MX Desk Mount LCD Arm, 2 pages.
Ergotron, 45-174-300 Neo Flex® LCD Arm, 2 pages.
Ergotron, 33-310-060 Neo Flex® LCD Stand, 2 pages.
Hafele UK Ltd., Heavy Duty Spring/Long Arm, 2 pages.
Humanscale, M2 Articulating Monitor Arm, 1 page.
Humanscale, M4 Articulating Monitor Arm, 1 page.
Humanscale, M7 Articulating Monitor Arm, 1 page.
Innovative Office Products, 7Flex® LCD Arm (24"), 1 page.
Innovative Office Products, EVO® LCD Arm 5545, 1 page.
International Search Report for International Application No. PCT/GB2011/000874, dated Dec. 15, 2011, 4 pages.
Written Opinion of the International Searching Authority for International Application No. PCT/GB2011/000874, dated Dec. 15, 2011, 14 pages.
International Preliminary Report on Patentability for International Application No. PCT/GB2011/000874, dated Dec. 10, 2012, 15 pages.
Office Action from U.S. Appl. No. 11/270,026, dated Nov. 16, 2007, 10 pages.
Notice of Abandonment from U.S. Appl. No. 11/270,026, dated May 30, 2008, 2 pages.
Search Report for Great Britain Application No. 1009680.8, dated Sep. 15, 2010, 1 page.
Search Report for Great Britain Application No. 1009680.8, dated Feb. 17, 2011, 3 pages.
Colebrookbossonsaunders line drawing and pricing sheet entitled "Wishbone arms on 400 mm post with Back to back bracket," dated May 17, 2010, 1 page.
Colebrookbossonsaunders line drawing and pricing sheet entitled "Two sets of Whshbone arm on 400mm post," dated May 17, 2010, 1 page.
Colebrookbossonsaunders line drawing and pricing sheet entitled "Daisyone arms on 500 mm post," dated May 17, 2010, 1 page.
Colebrookbossonsaunders line drawing and pricing sheet entitled "Wishbone Rotation arms on 400 mm post with Back to back bracket," dated May 17, 2010, 1 page.
Colebrookbossonsaunders line drawing and pricing sheet entitled "Zorro arms on 300mm post with Back to back bracket," dated May 17, 2010, 1 page.
Colebrookbossonsaunders line drawing and pricing sheet entitled "Gissele gas lift arms on 200mm post with Back to back bracket," dated May 17, 2010, 1 page.
Colebrookbossonsaunders line drawing and pricing sheet entitled "Two sets of Rodney arm," dated May 17, 2010, 1 page.
Colebrookbossonsaunders line drawing and pricing sheet entitled "Wishbone arms mounted to 1000mm toolbar on 400mm posts," dated May 17, 2010, 1 page.
Colebrookbossonsaunders line drawing and pricing sheet entitled "Wishbone Plus on 500mm post with SP1320 dual monitor mount," dated May 17, 2010, 1 page.
Partial International Search Report for International Application No. PCT/GB2011/000874, dated Oct. 31, 2011, 2 pages.
Office Action issued in U.S. Appl. No. 13/702,180, mailed Sep. 30, 2014, 10 pages.

* cited by examiner

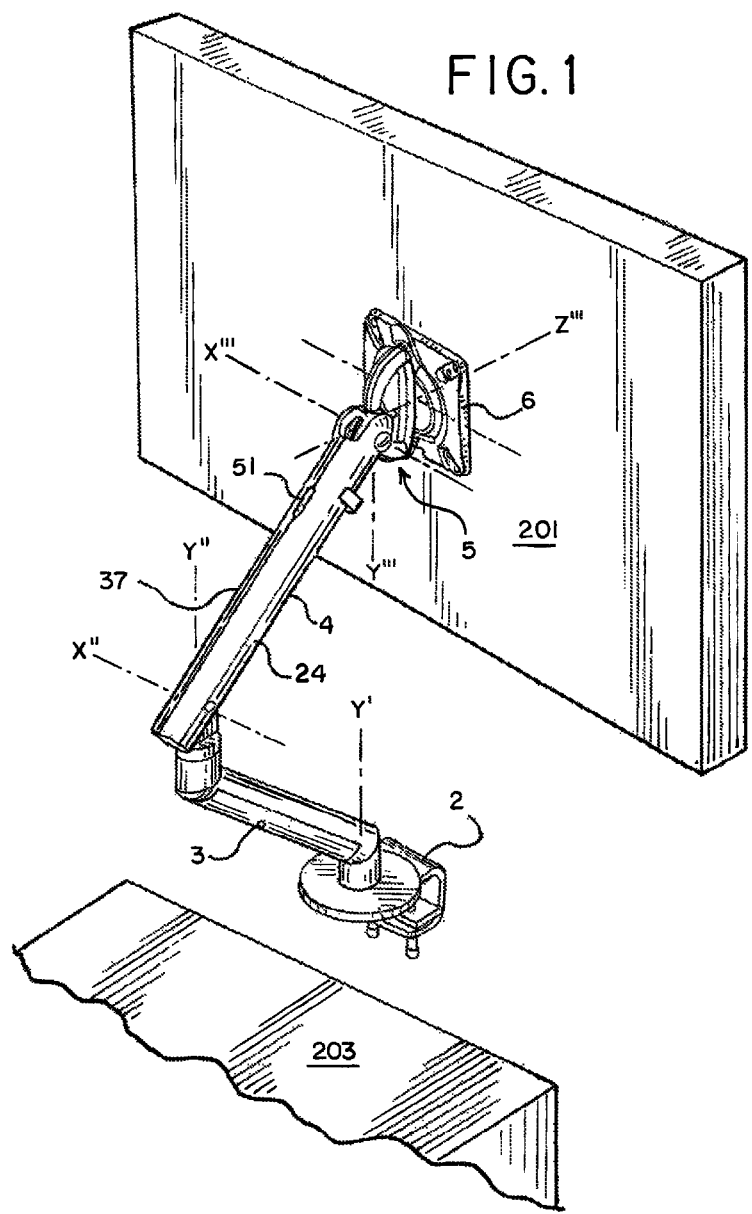

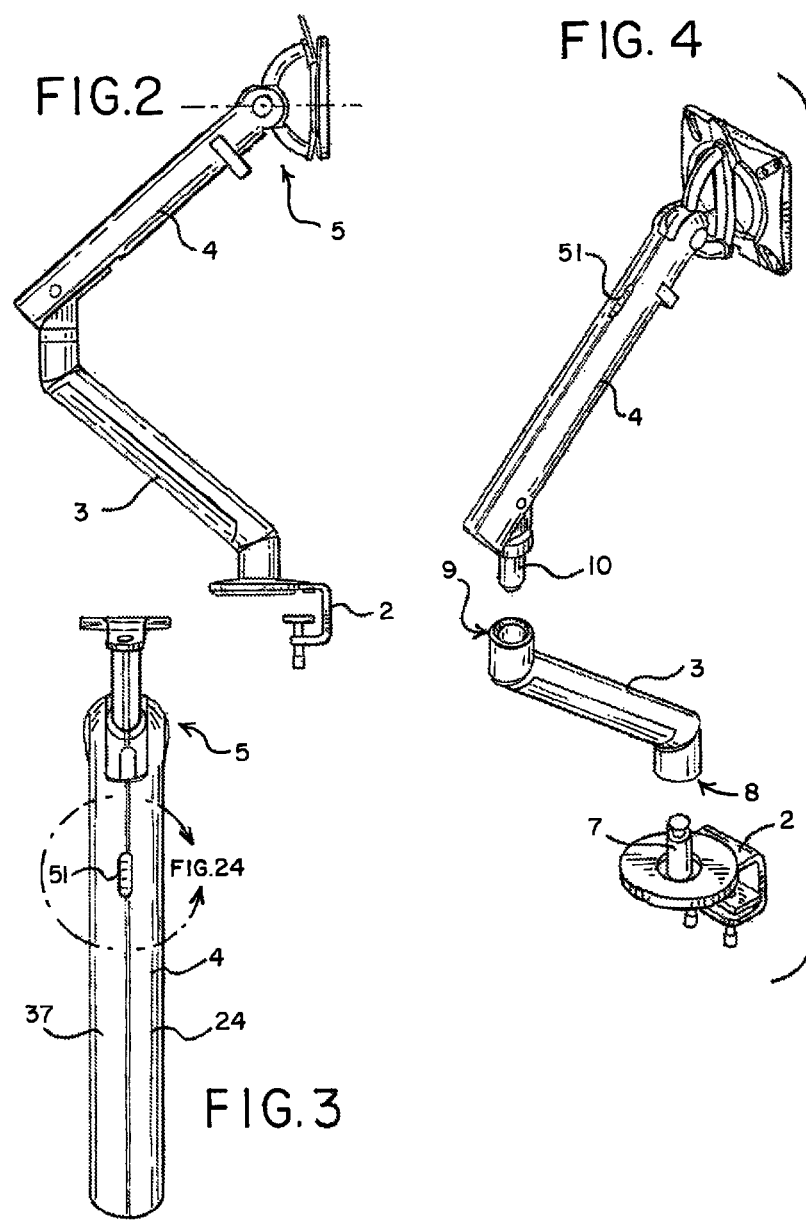

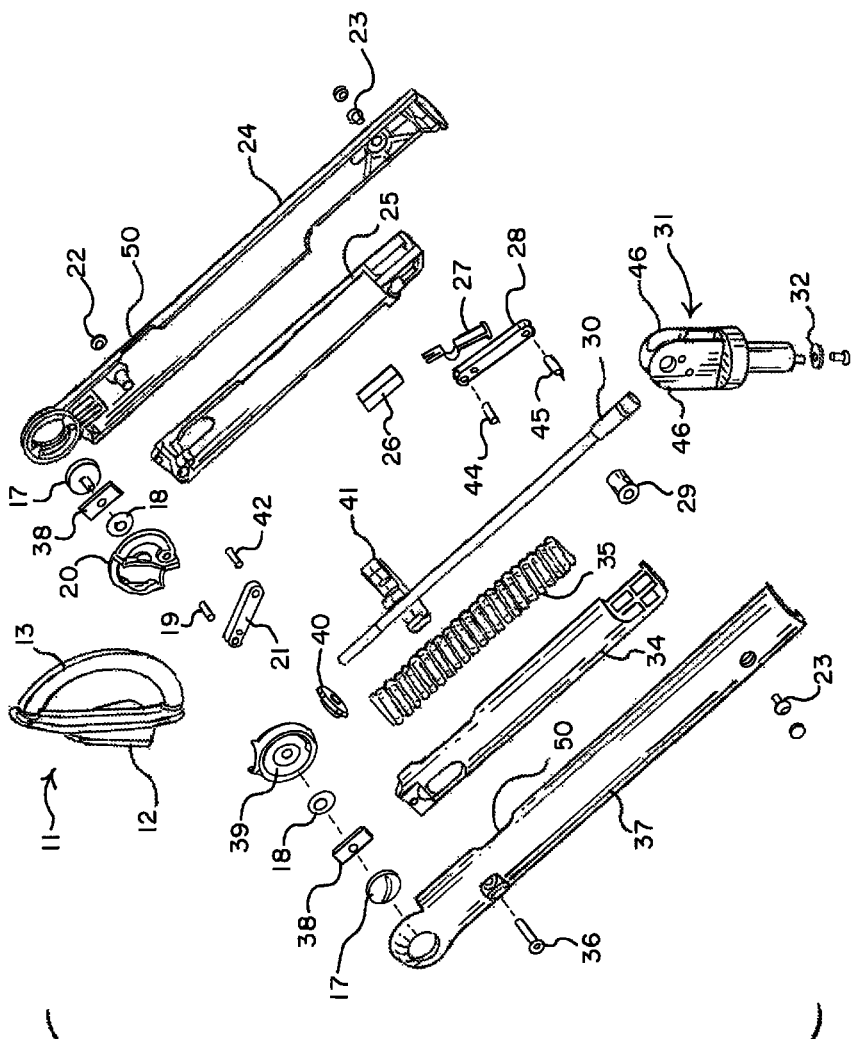

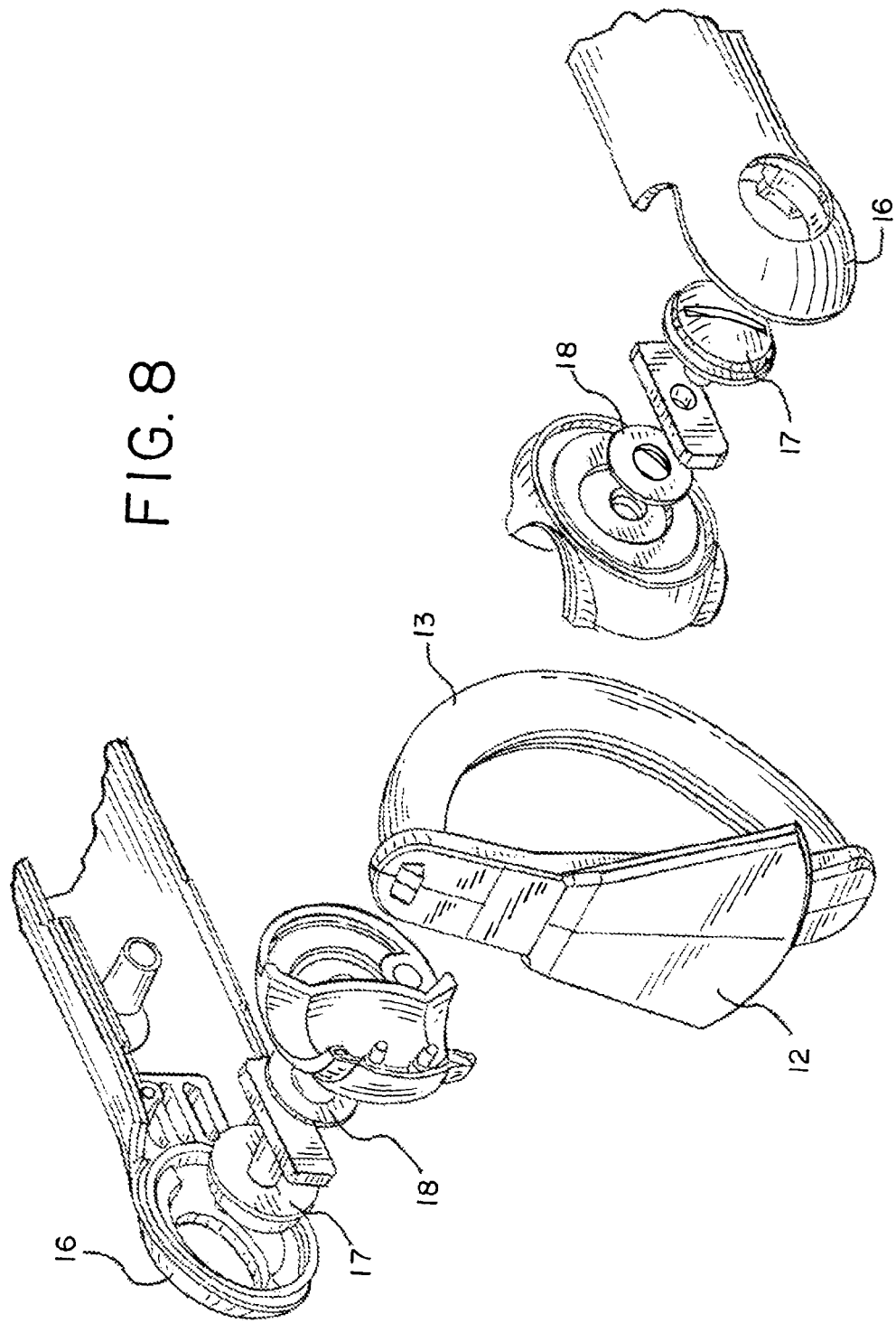

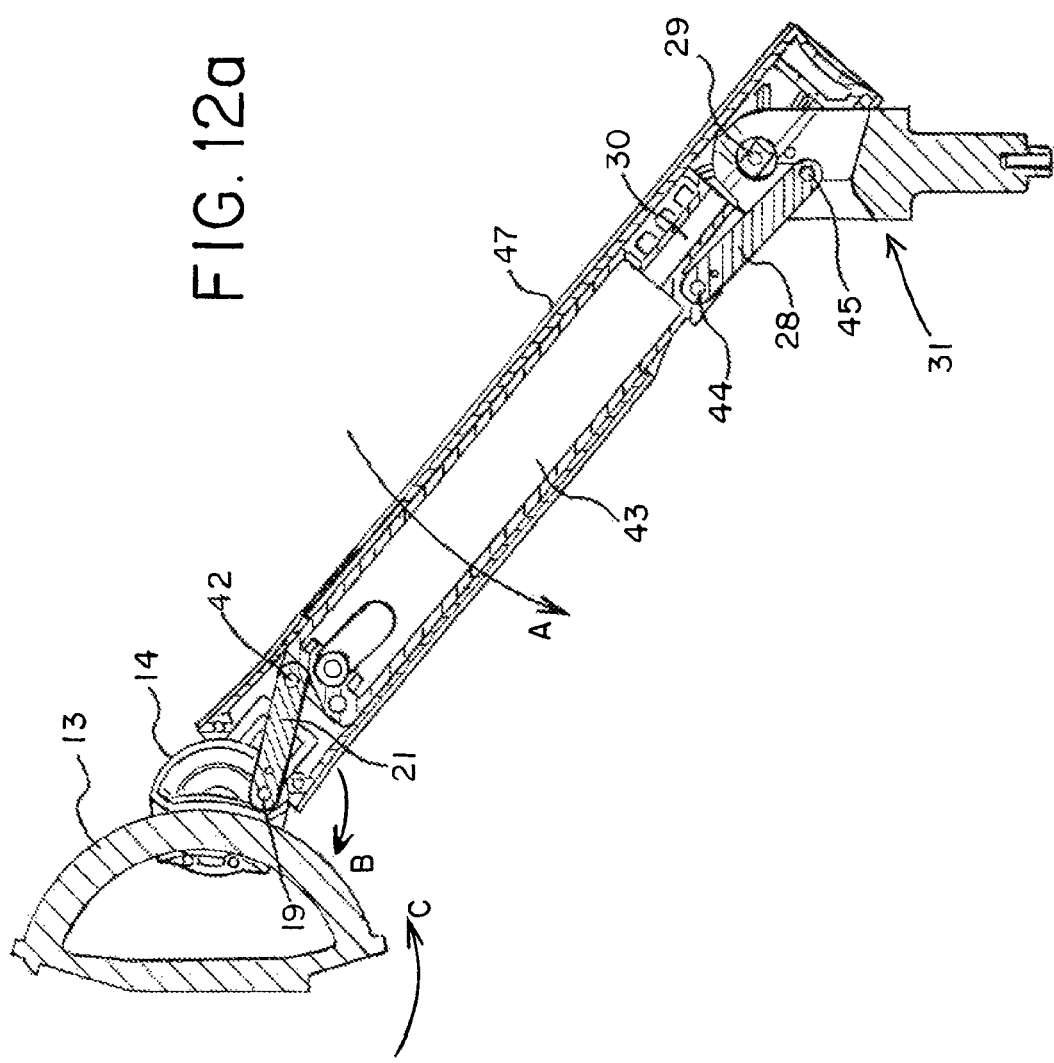

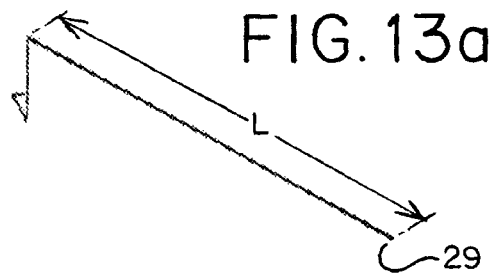
FIG. 13a
W-WEIGHT
P-PIVOT
L-ARM LENGTH
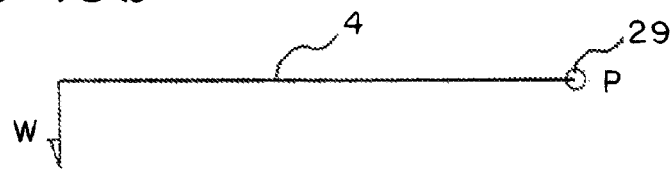
FIG. 13b
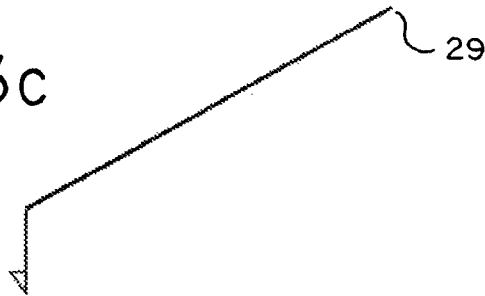
FIG. 13c
FIG. 14
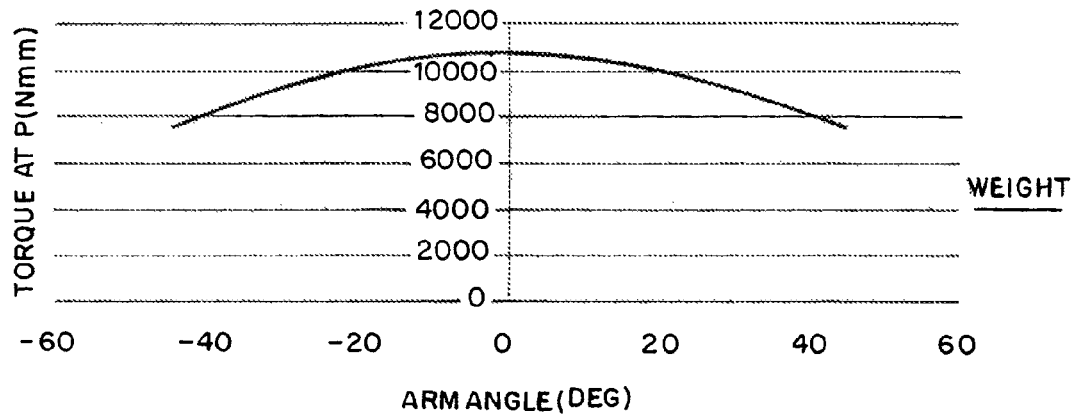
TORQUE AT P CREATE BY WEIGHT W - WEIGHT
P - PIVOT
L - ARM LENGTH
b - SLIDING DISTANCE
d - PIVOT DISTANCE
G - SPRING FORCE
S - FORCE OPPOSED BY LINK
e - DISTANCE PERPENDICULAR TO LINK (FORCE)
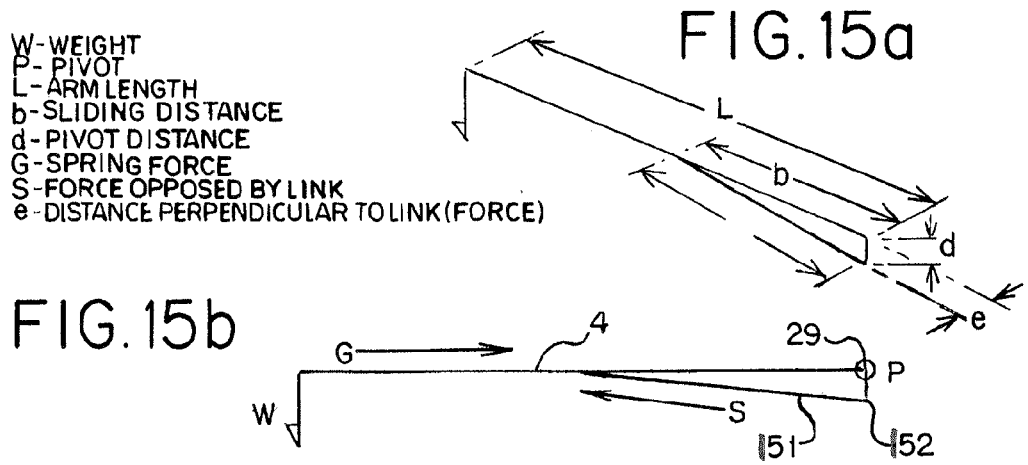
FIG.15a
FIG.15b
FIG.15c
FIG.16
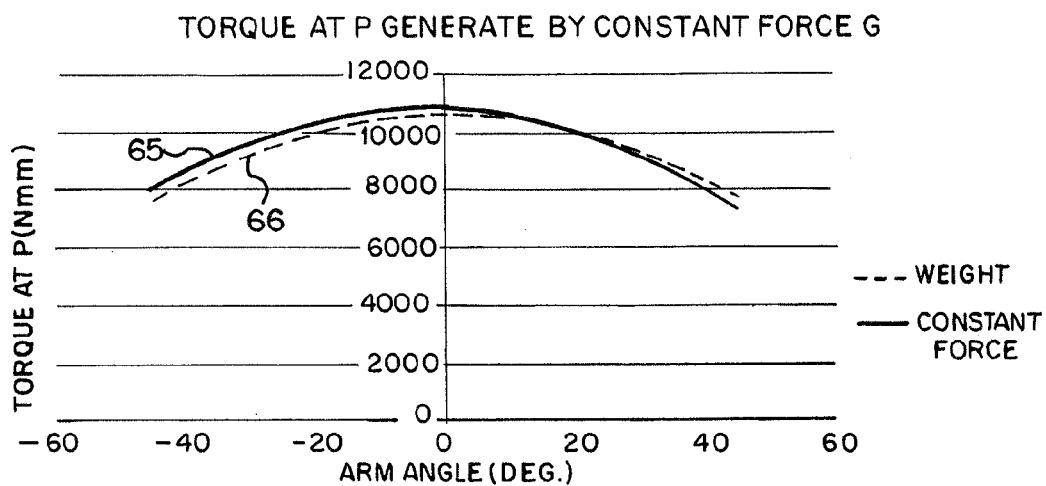
FIG.17
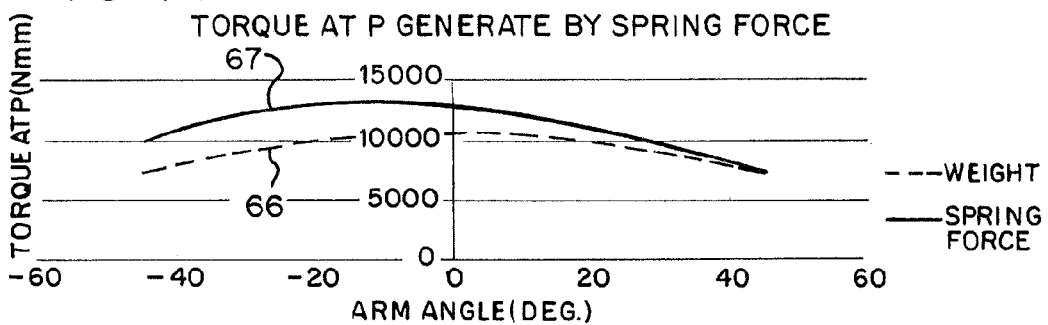

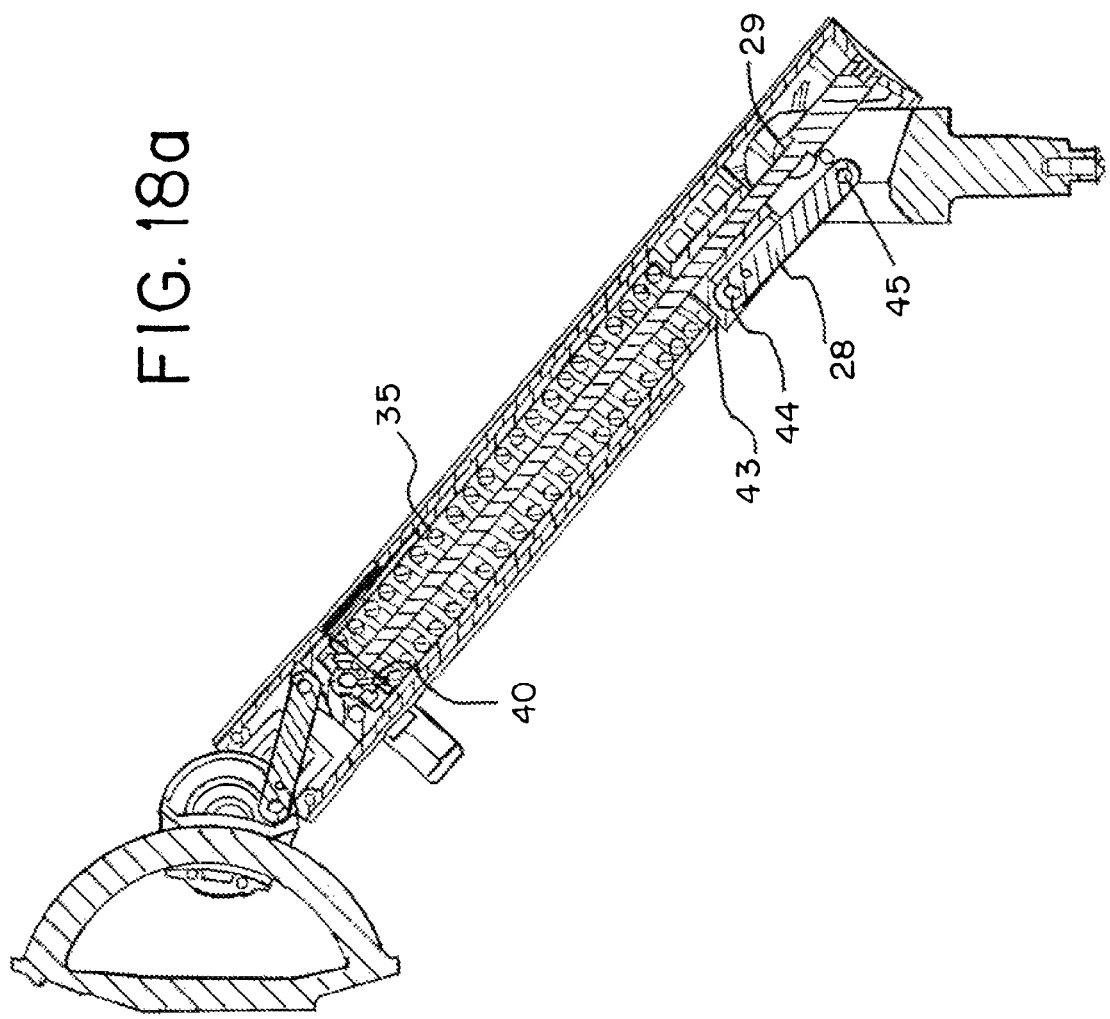

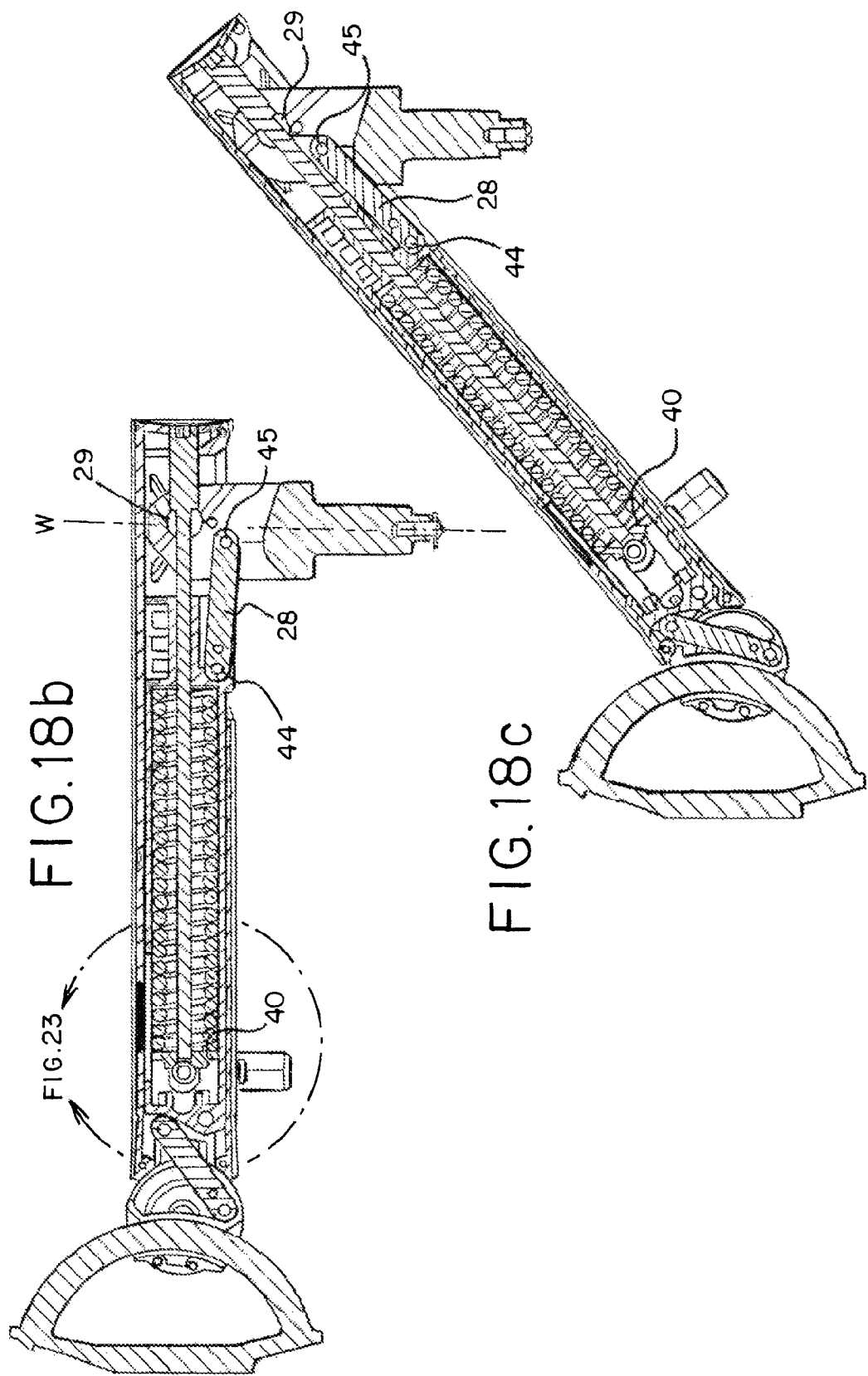

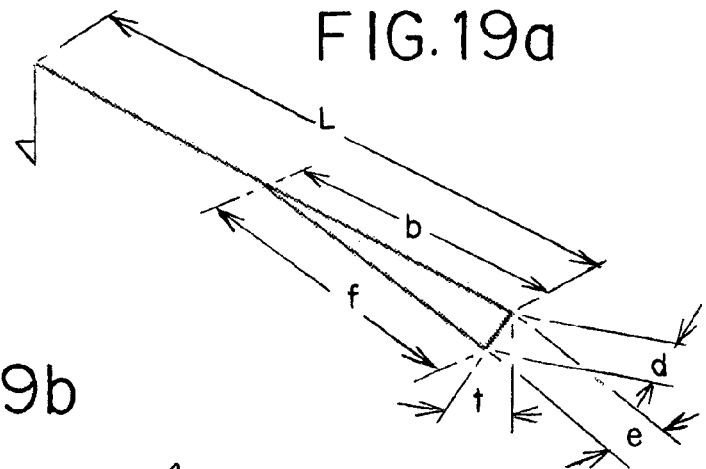
FIG. 19a
W — WEIGHT
P — PIVOT
L — ARM LENGTH
b — SLIDING DIST.
d — PIVOT DIST.
G — SPRING FORCE
S — FORCE OPPOSED BY LINK
e — DIST. PERPENDICULAR TO LINK (FORCE)
FIG. 19b
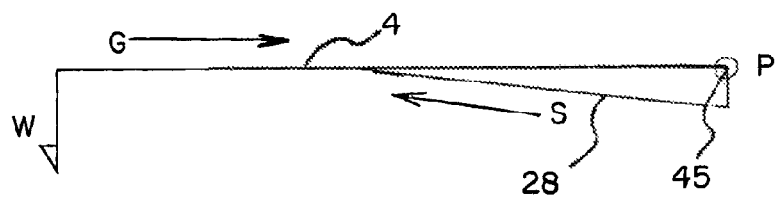
FIG. 19c
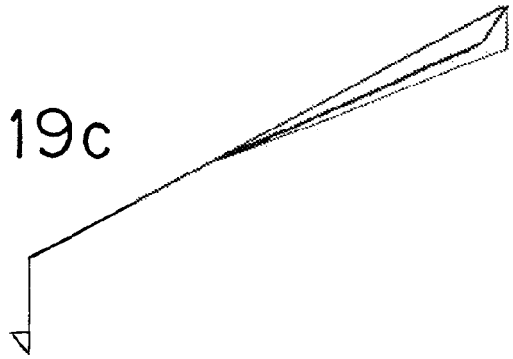
FIG. 20
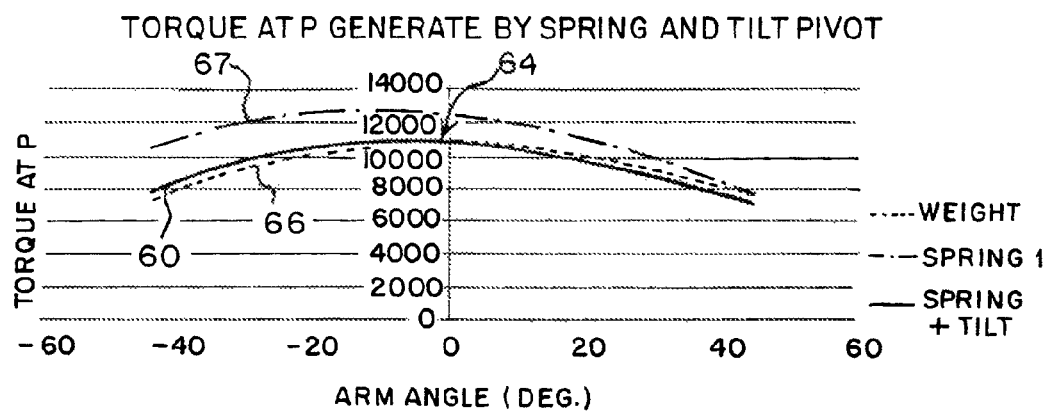

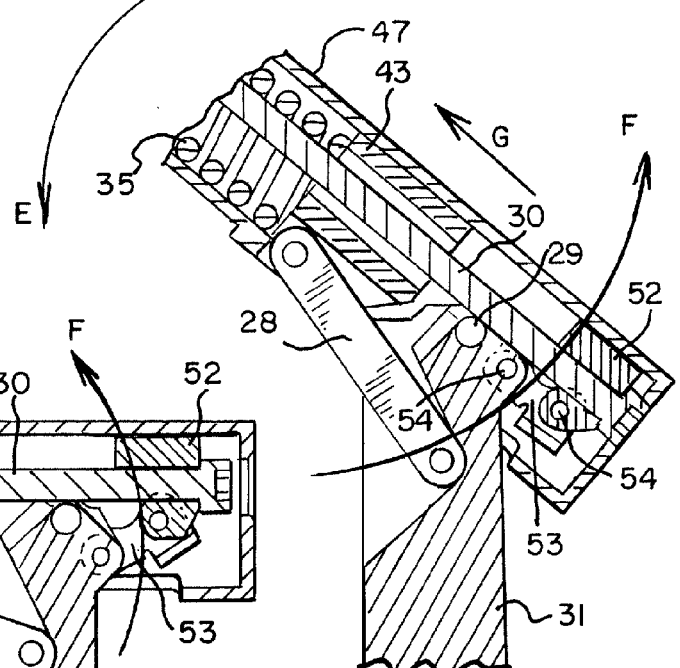
FIG. 22a
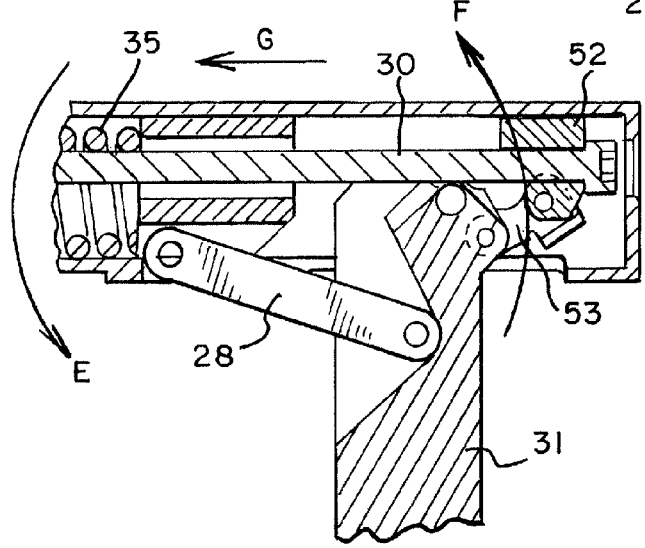
FIG. 22b
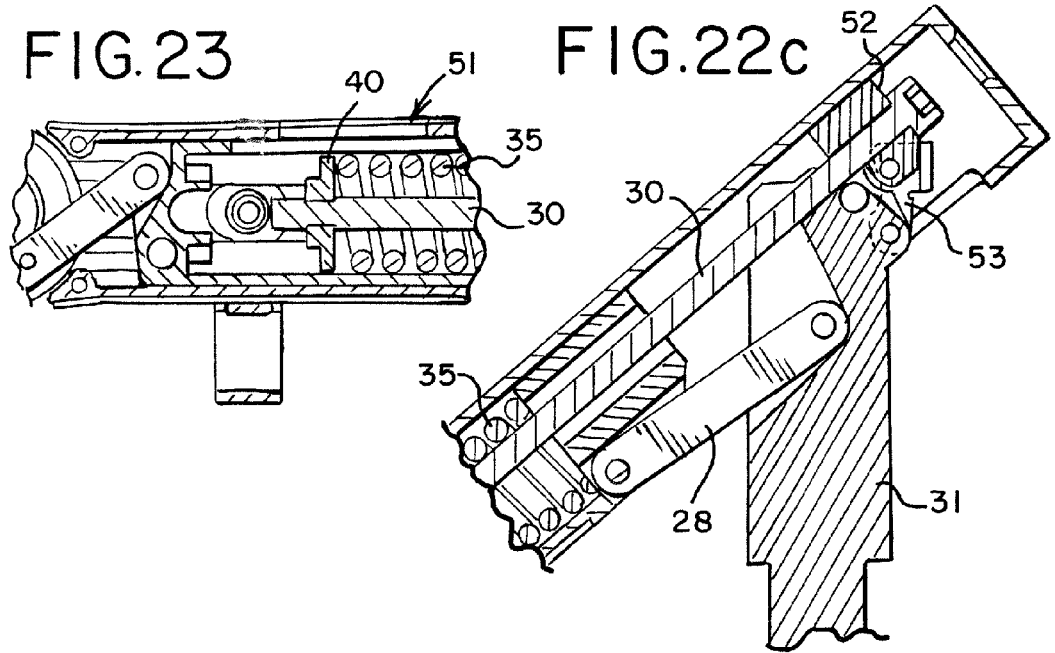
FIG. 23
FIG. 22c

SUPPORT SYSTEM

FIELD OF THE INVENTION

The present invention is concerned with a support system. Particular embodiments of the invention are concerned with a moveable support arm for a monitor or display device.

BACKGROUND

Modern screen-based display devices are typically flat-screen monitors such as liquid crystal display (LCD) or plasma screen displays. Such devices can be mounted on elevated support devices such as a support arm which can then be secured to a surface such that the flat-screen monitor is held above or in front of the surface.

Support systems for monitors are known which allow for movement in three dimensions of the head, mount or bracket on which the monitor is mounted. This is so as to allow for a full range of adjustment of the monitor. GB 2 438 581 and U.S. Pat. No. 7,438,269 both disclose mounts or brackets including an arcuate connection which allows a monitor to be pivoted about a substantially horizontal virtual pivot axis. In U.S. Pat. No. 7,438,269, the virtual pivot axis passes through the centre of gravity of a monitor or display so as to reduce the forces necessary to hold the mount in place at a selected position on the arcuate connection.

In order to allow for adjustment about a substantially vertical axis (or an axis orthogonal to the axis of the arcuate connection), known arrangements such as those disclosed in GB 2 438 581 and U.S. Pat. No. 7,438,269 have a second pivoting mechanism entirely separate from the first. The second pivot is a separate vertical rod-like element defining a vertical axis. This second pivot is distinct and separated from the pivot of the arcuate connector.

These prior art arrangements require two separate and distinct pivot arrangements. They are therefore relatively complicated and expensive to build, have two pivots (and therefore more moving parts) which can fail and are relatively unsightly.

Support systems for monitors comprising an articulated arm arrangement for raising and lowering a monitor are known with tiltable mount or bracket mechanisms which keep the monitor in the same plane as the arm moves up and down. The known arrangements such as those disclosed in US 2004/0245419 have a four bar linkage or parallelogram arrangement in which there is a second link or arm below (or above) and parallel to the main support arm and pivotally coupled to the tiltable mount or bracket on which a monitor is mounted. The second link or arm is pivotally coupled to the mount or bracket below (or above) the pivot between the main support arm and the mount, and also pivotally coupled to the base or support element to which the other end of the main support arm is pivotally coupled at a point below (or above) the pivot between the main support arm and the base or support element. The main support arm and the second link arm are parallel to each other and the linkage (which can be considered to be a line drawn between) the pairs of pivots on each of the base element and mount are also parallel to each other.

This parallelogram four-bar linkage means that as the support arm is moved up and down the linkage between the two pivots on the tilt mount remains in the same plane parallel to the linkage between the two pivots on the base element.

A disadvantage of the known four-bar parallelogram linkage arrangements is the need to provide a second link parallel to and separate from the support arm. Such arrangements therefore must have a second visible (and therefore unsightly) link or arm parallel to the main support arm. Alternatively, such parallelogram arrangements have a large deep casing which can house the main support arm, the second parallel link and the space therebetween. This is bulky and therefore also unsightly.

Another problem with articulated support arms for loads such as monitors or display devices which move up and down as they pivot about a horizontal axis, is the varying torque created by the constant weight of the monitor applied about the horizontal axis. As the arm moves up and down the distance from the load at the end of the support arm to the other end of the support arm and the pivot between the support arm and its base varies.

In order to oppose this varying torque it is known (see, for example, US 2004/0245419) to provide a compression spring which provides a variable force to create a torque to oppose and match the torque created by the weight of the load. The spring is subject to a cam arrangement which controls the degree of compression of the spring and hence the force it applies. Cam arrangements of the type disclosed in US 2004/0245419 are relatively complex and hence expensive to make.

Another problem with arrangements in which a biased mechanical spring, gas spring or other biasing element provides the force necessary to balance the weight of the monitor is the need to set up or adjust the spring or biasing element when a monitor is placed on it so that the torque provided by the spring closely matches the torque provided by the weight of the monitor. This is done by a manual adjustment of the spring position of a surface against which the spring rests for a compression or expansion spring, and for a gas spring (which provides a constant force) by adjustment of the orientation and position of the end of the gas spring relative to the monitor mount, monitor and principal longitudinal axis of the support arm (i.e. the geometry of the lines of application of the various forces/torques is adjusted to achieve balance).

The installation technician manually adjusts the position of an end of the spring using trial and error until the torque provided by the weight of the monitor is balanced by the torque from the spring and the monitor can be moved easily and yet remains in position when positioned at a particular elevation by an operator. The process of such manual installation is particularly cumbersome and time consuming when a large number of monitors and support arms are being installed as is often the case when, for example, an office is being fitted out with a number of identical monitors and support arms.

SUMMARY

In a first aspect, one embodiment of a support system provides a single simple mechanism which allows adjustment about two orthogonal pivots. This mechanism is easier and cheaper to make than the know arrangements and is aesthetically more pleasing.

In a second aspect, a support system eliminates the need for a second parallel link separated from the first and a vertical separation between the two parallel links. This second aspect therefore allows for a more compact and aesthetically pleasing support arm which keeps its load mount in the same plane as the support arm moves up and down.

In third and fourth aspects, a support system provides alternative arrangements for varying the torque applied to oppose the variations in torque resulting as the support arm is pivoted about a horizontal axis. One embodiment of the third aspect provides a mechanism which allows the variations in torque provided by the support arm as its pivots and which opposes the weight of a load on the support arm to better match the variations in torque provided by the weight as the support arm pivots. The inventors of the subject application are the first to realize that taking the step of moving the proximal force transmission link pivot away from its usual position on the line through the proximal support arm pivot and substantially orthogonal to the longitudinal axis of the support arm when this is at the mid-point of its range of movement about the proximal support arm pivot allows one to better match the shape of the graphs of variation in supporting torque and load weight torque with support arm movement to each other and hence better support a load on the support arm. The inventors are the first to appreciate that the counter-intuitive step of moving away from the essentially symmetrical proximal support arm pivot and proximal force transmission pivot arrangement of the prior art actually allows one to produce a more symmetrical variation in supporting torque to better match load weight torque.

In a fourth aspect, a mechanism reduces undesirable variations in the dimensions, and hence compression or expansion, of the spring. This reduction in the undesirable variations means that the forces produced by the spring as the support arm moves better match the torque required to support a load weight on the distal end of the support arm.

The inventors of the invention described in this application also have appreciated that it possible to significantly reduce the time taken to install a number of identical monitors and support arm arrangements by providing a mechanism for copying or carrying over the adjustment necessary for a first installation to other further installations without the need for further time consuming trial and error based manual adjustment.

In another aspect, one embodiment of a support arm for supporting a load such as a display device includes a balancing mechanism providing a force or torque to balance the weight of a display device on or near a first end of the support arm, an adjustment mechanism to adjust the magnitude of the force or torque provided by the balancing mechanism, and an indicator arrangement on the support arm for providing a visual indication of the magnitude of force or torque provided by the balancing mechanism.

Embodiments of this support arm allow an installation operative to note what adjustment was necessary for a particular support arm and monitor combination and then carry over that noted level of adjustment to further installations of the same pair of support arm and monitor type.

In one embodiment, the balancing mechanism is a resilient member acting against a movable biasing surface and the adjustment mechanism adjusts the position of the biasing surface and thereby alters the force exerted by the resilient member against the biasing surface, and the indicator arrangement indicates the position of the biasing surface. Such an arrangement is easy to construct and operate.

Preferred embodiments of the present invention will now be described, by way of non-limiting example only, with reference to the attached figures. The figures are only for the purposes of explaining and illustrating preferred embodiments of the invention and are not to be construed as limiting the claims. The skilled man will readily and easily envisage alternative embodiments of the invention in its various aspects.

BRIEF DESCRIPTION OF THE DRAWINGS

FIG. 1 is a perspective view of a first embodiment of the support device;
FIG. 2 is a side view of the support device of FIG. 1;
FIG. 3 is a top view of the support device of FIG. 1;
FIG. 4 is a partially exploded view of the support device of FIGS. 1 to 3;
FIG. 5 is an exploded view of the upper arm of the support device of FIGS. 1 to 4;
FIG. 8 is an exploded view of the upper end of the upper arm and the mounting and movement head of FIGS. 1 to 6;
FIGS. 12a to 12c are cross-sectional views along part of section X-X of FIG. 3 which illustrate the invention in its second aspect as the upper support arm pivots;
FIGS. 13 and 14 illustrate the variation in torque created about the pivot on the bottom end of the upper arm of FIGS. 1 to 13 by the weight of, for example, a monitor mounted at its upper end, as the support arm pivots about that pivot at its bottom end;
FIGS. 15 to 17 illustrate how the torque of FIGS. 13 and 14 is opposed in known support device arrangements;
FIGS. 18a to 18c are cross-sectional views similar to those of FIGS. 12a to 12c illustrating the invention in its third aspect;
FIGS. 19 and 20 illustrate how the torque created at the pivot by the weight of a load o on the lower end of the upper support arm is opposed in the arrangement of FIGS. 1 to 12, and 18;
FIGS. 22a to 22c are cross-sectional views along section XXI-XXI in FIG. 21a illustrating the invention in its fourth aspect;
FIG. 23 is an enlarged, partial cross-sectional view of a support arm taken along line 23 of FIG. 18b.

DETAILED DESCRIPTION OF THE PRESENTLY PREFERRED EMBODIMENTS

Figure 7:
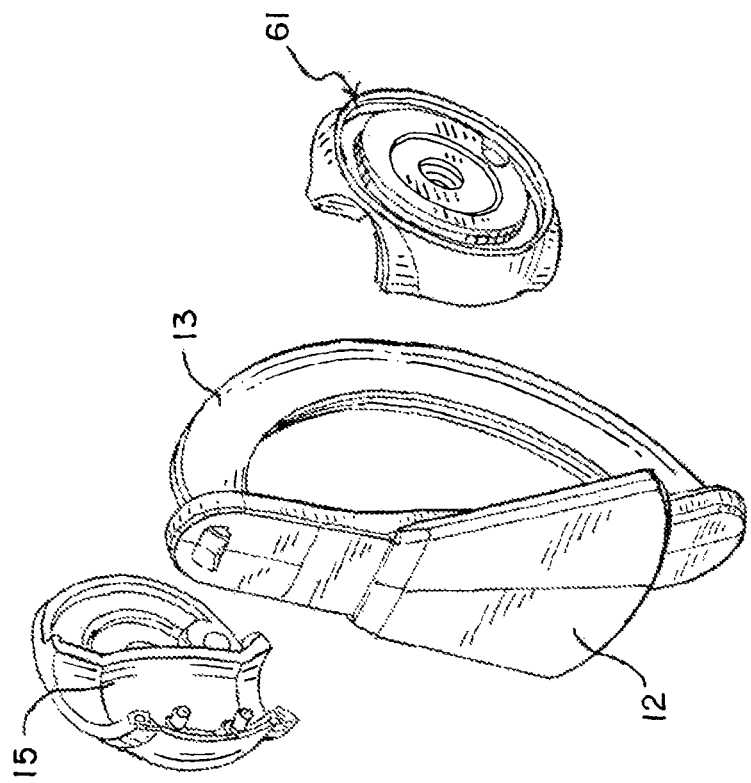
FIG. 7 is a partially exploded view of portions of the mounting and movement head of FIG. 6.
Figure 6:
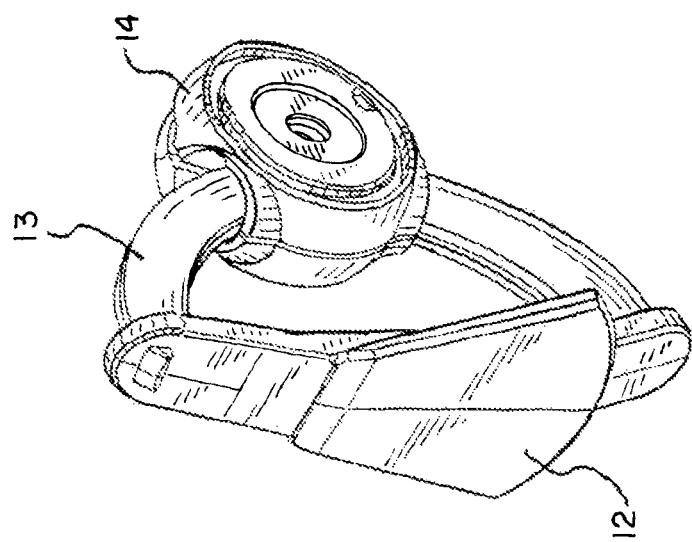
FIG. 6 is a perspective view of the mounting and movement head of the device of FIGS. 1 to 5.

Referring to FIGS. 1 to 3, a support device 1 includes a base element, including a table securing element 2 and a lower arm 3, an upper arm 4, a monitor mounting head and pivot 5, and a monitor plate 6, or device mounting element, for securing to the back of a monitor 201 to be supported. The table securing element 2 has a screw or clamp arrangement for removably securing the element 2 to a table or other surface 203 and an upstanding pin 7 received within a corresponding hole 8 in the end of the lower arm 3 such that the lower arm 3 can rotate about a vertical Y' axis (see FIG. 1) relative to the table securing element 2. The lower arm 3 then has a hole or female coupling 9 at its upper end to receive a pin or male coupling 10 at the bottom end of the upper arm 4. The upper arm 4 can rotate about a vertical axis Y" (see FIG. 1) relative to the lower arm 3 by virtue of this pin and hole engagement.

Referring to FIG. 1, the lower arm 3 can rotate relative to the table securing element 2 about a vertical axis Y', the upper arm 4 can rotate relative to the lower arm 3 about a vertical axis Y" and a horizontal axis X", and (as discussed in more detail below) the mounting head 5 can rotate relative to the distal end of the upper support arm 4 about two orthogonal axes (one substantially horizontal axis X''' and the other substantially vertical axis Y'''). The monitor supporting head 5 can also rotate about a horizontal axis Z''' orthogonal to the X''' and Y''' axes.

Referring to FIGS. 5 to 8, the mounting head 5 comprises a movement joint hoop 11 with a fixing portion 12 for slidable engagement with the monitor supporting plate 6, and a hoop portion 13 of substantially circular cross-section. A motion joint 14 with an internal circular bearing surface 15 corresponding to the circumference of the hoop 13 is positioned on the hoop 13 and can move along the hoop and rotate around the hoop. The motion joint 14 is a two-part plastics moulding. The plastics moulding is held between two projecting portions 16 at the distal end of the upper support arm 4. Slotted screws 17, in combination with the portions 16 defining a distal support arm pivot, apply pressure to the outside of each side of the moulding via rectangular nuts and Belleville washers 18 so that the motion joint is frictionally engaged on the hoop.

The projecting arms 16 can rotate relative to the motion joint 14 such that the support arm can rotate about horizontal axis X'''. Projecting portions 60 on the inside of the upper arm projections 16 engage a track 61 on the motion joint 14 to allow this relative rotation about axis X'''.

Referring to FIG. 5, the support device 1 includes movement joint hoop 11, distal front link pivot pin 19, proximal front link pivot pin 42, motion joint moulding left half 20, motion joint adjustment screws 17, Belleville washers 18, front link 21, thin hex nut 22, mid joint button screws 23, upper arm casting left half 24, spring slider moulding left half 25, friction pad 26, anti-finger trap moulding 27, power link 28, mid joint pivot pin 29, force adjustment screw 30, mid joint 31, steel washer 32, spring slider moulding right half 34, compression spring 35, head screw 36, upper arm casting right half 37, rectangular nuts 38, motion joint moulding right half 39, spring nut plate 40 and cable management clip 41.

Figure 10A:
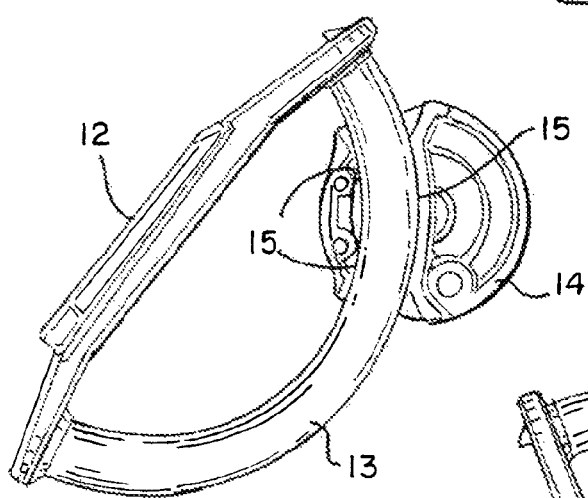
FIGS. 10a and 10b are cross-sectional views along part of section X-X in FIG. 3 illustrating adjustment of the mounting and movement head in a first plane.
Figure 10B:
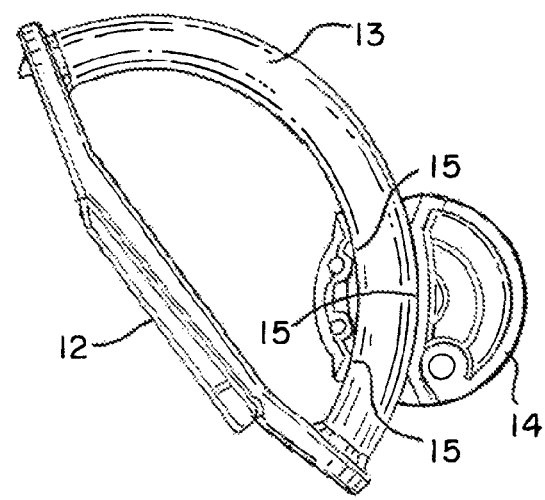

As illustrated in FIGS. 10a and 10b, the motion joint 14 can move relative to the hoop 13. In this application we will usually refer to movement of the motion joint along the hoop. This expression refers to relative movement in a direction along the curvature of the hoop and includes movement of the motion joint with the hoop remaining still, movement of the hoop with the motion joint remaining still and movement of both the motion joint and hoop.

Figure 11C:
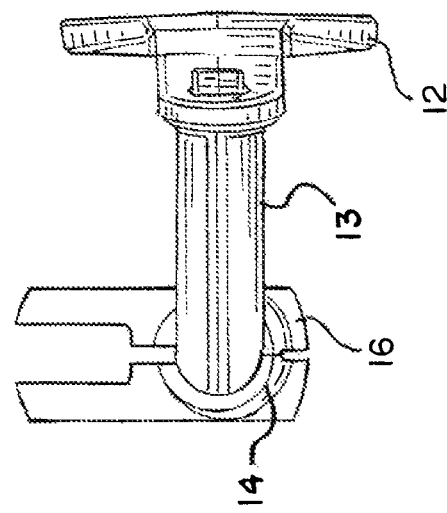
FIGS. 11a to 11c are top views of the mounting and movement head illustrating adjustment of the mounting and movement head in a second plane orthogonal to the plane of the section of FIGS. 10a and 10b.
Figure 11B:
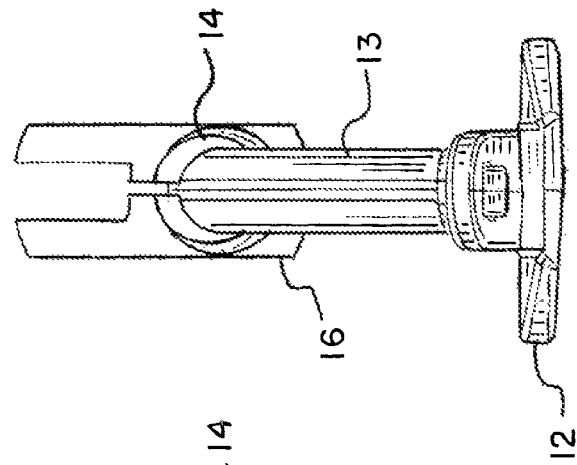
Figure 11A:
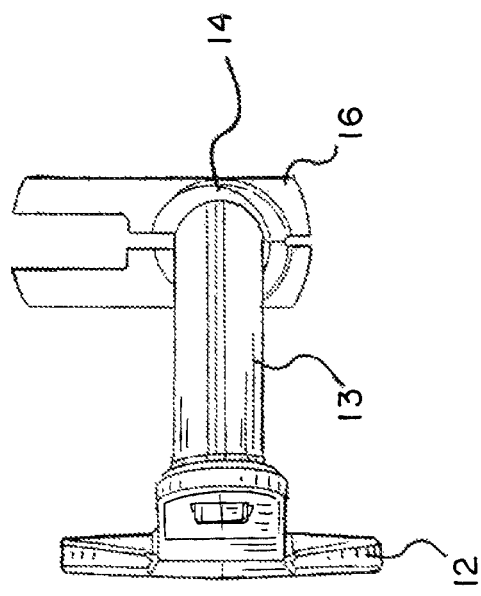

In a particularly preferred embodiment of the invention, the hoop 13 lies on the circumference of a circle whose centre lies at or near the centre of gravity of the monitor or other element being supported on the mounting head. This reduces the magnitude of the frictional force which the bearing surfaces 15 of the motion joint must apply to the hoop in order to hold its position on the hoop. As illustrated in FIGS. 11a to 11c, the motion joint 14 can also rotate relative to the hoop 13 and a combination of the movement along and about the hoop means that the, for example, monitor 201 on the mounting head 5, can be rotated about orthogonal X''' and Y''' axes. In this application we usually refer to rotation of the motion joint about the hoop. This expression refers to relative rotation about a curved axis running down the middle of the hoop and includes rotation of the motion joint with the hoop remaining still, rotation of the hoop with the motion joint remaining still and rotation of both the motion joint and hoop.

The mount fixing portion 12 is held in a turntable like portion of the monitor supporting plate 6 such that the monitor supporting plate 6 can rotate relative to the mount fixing portion 12 about axis Z''' (see FIG. 1).

Figure 9:
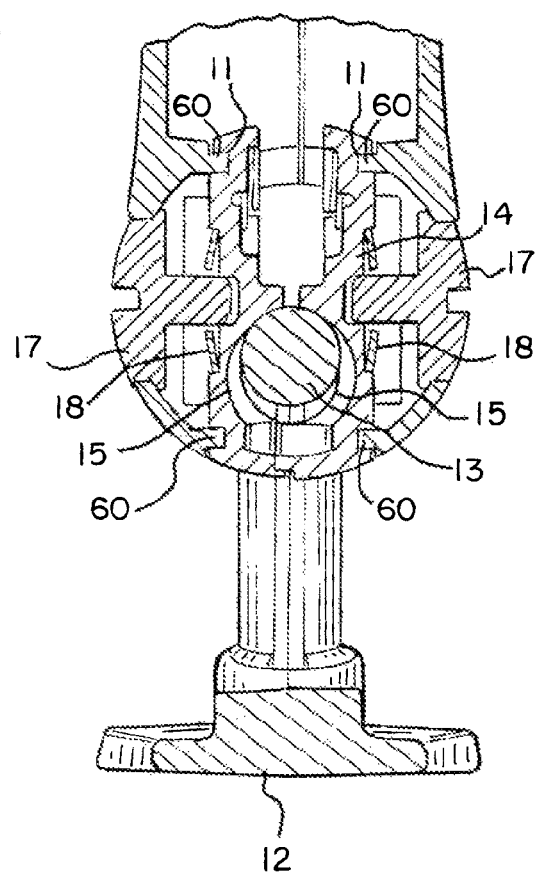
FIG. 9 is a cross-sectional view of aspects of the mounting and movement head along section IX-IX in FIG. 2.

The upper support arm 4 is a two-part metal casting whose two halves 24, 37 are held together by a screw and nut coupling 36, 22 towards the distal end of the upper support arm and a pair of proximal mid-joint button screws 23 which each pass through a pair of holes in the upper end of the mid joint 31 and engage opposite ends of the mid joint pivot pin 29, which defines a proximal support arm pivot, so that the upper support arm 4 can pivot about that mid joint pivot pin 29 and hence about horizontal axis X" (see FIG. 1). The distal end of each half of the upper support end casing forms one half 16 of a U-shaped motion joint fixing portion so that together the two halves of the casting capture the motion joint 14 as described above (see FIGS. 8 and 9). An upper support arm front link 21 or distal slider link, is mounted at its distal end on the distal front link pivot 19 held between the two halves 20, 39 of the motion joint 14 and at its proximal end on a proximal front link pivot pin 42 pivotally mounted on the distal end of a sliding carriageway or spring slider 43 supported within the upper arm casing. The spring slider 43, or slider element, is a two-part moulding 25, 34 and the proximal front link pivot pin 42 is held between the distal ends of the two halves to support the front link 21.

The spring slider 43 has a compression spring 35 (not shown in FIGS. 12a to 12c) inside it which engages at its distal end with a spring nut plate 40, which defines a moveable spring surface, mounted on the distal end of a force adjusting screw 30. At initial set up or final manufacture of the support device 1, the force adjustment screw is set to define a particular separation between the spring nut plate 40 and the proximal end of the spring slider 43. This defines the length of the space for the compression spring 35 and hence determines the force supplied by the spring 35, or force generating member. The force adjusting screw 30, otherwise referred to as a rod or spring surface support element, can adjust the position of the spring nut plate 40 within the spring slider moulding and thereby increase or decrease the length of the compression spring and hence, respectively, decrease or increase the force that spring will apply to the spring slider and spring nut plate, and hence to the rear power link 28, otherwise referred to as a proximal slide link or a force transmission link, pivotally connected to the proximal end of the spring slider 43 against which the proximal end of the spring 35 acts.

Figure 24:
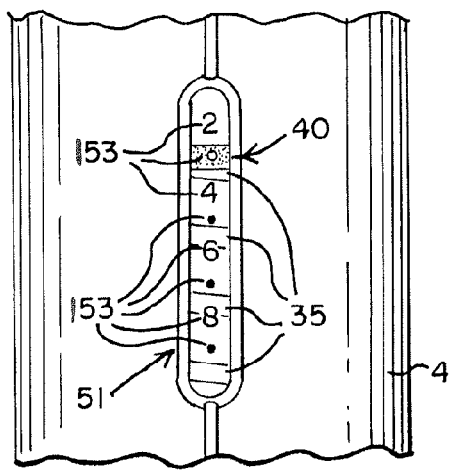
FIG. 24 is an enlarged, partial top view of a support arm taken along line 24 of Figure.
Figure 25:
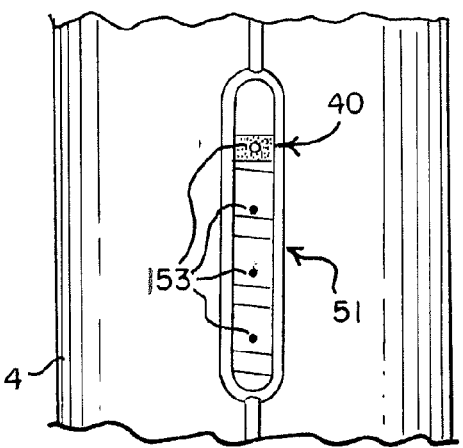
FIG. 25 is an enlarged, top view of an alternative embodiment of an indicator window arrangement.
Figure 26:
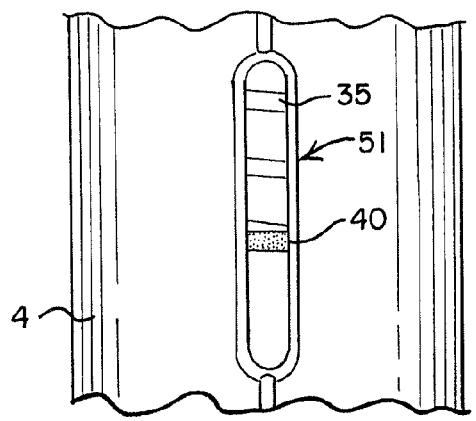
FIG. 26 is an enlarged, top view of another alternative embodiment of an indicator window arrangement.
Figure 27:
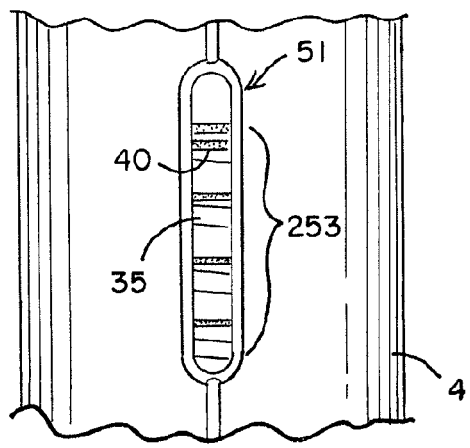
FIG. 27 is an enlarged, top view of another alternative embodiment of an indicator window arrangement.
Figure 28:
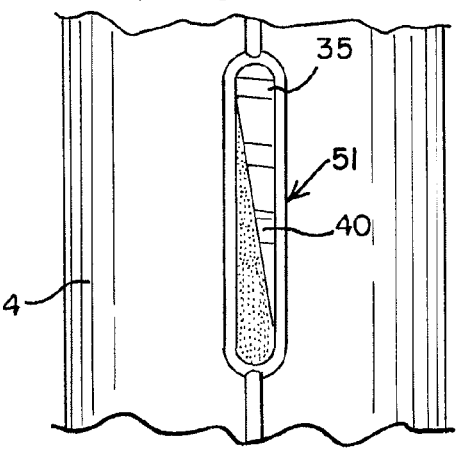
FIG. 28 is an enlarged, top view of another alternative embodiment of an indicator window arrangement.

Referring to FIGS. 1, 3 and 5, the two casing halves 24, 37 each have indents 50 which, when the upper arm is assembled, together define an indicator window 51 into which a lens is fitted. When assembled (see FIGS. 23-26) the spring nut plate 40 is visible through the indicator window 51, and functions as a marker. As shown in the embodiment of FIGS. 24 and 25, the indicator window includes markings 153, or indicia, positioned adjacent the marker, for example on the lens. Alternatively, the markings may be positioned on the casing adjacent the window. The visible spring nut plate 40 acts as a marker and combines with the indicia 153 provide an indication of the position of the spring nut plate, and hence the spring force applied by the spring 35. As shown in FIG. 26, the spring nut plate 40 alone, as viewed through the window 51, may provide the requisite indicia, by noting the relative position of the marker in the window (see, e.g., FIG. 26). In all embodiments, the position of the spring nut plate 40 provides a measure of the length of the spring 35 and hence of the biasing and the spring force provided by the spring. The indicia may take the form of alpha-numeric characters, such as numbers or letters (see, e.g., FIG. 24), or various symbols, such as dots or lines (see, e.g., FIG. 25), such that the installer can note the relative position of the marker to the indicia.

As shown in FIGS. 22a-c, the position of the spring nut plate 40 is adjusted by the force adjusting screw 30, and moves in the window 51, until the torque produced by the weight of the display device or monitor matches the torque provided by the spring 35 at all orientations of the display device. The display device or monitor should feel like it is floating at all orientations.

The best orientation for adjustment is as shown in FIG. 22b; the back of the monitor is at 90° to the upper support arm which is itself at 90° to the lower support arm. This position allows for easier and more precise adjustment.

An installation operative places the monitor and support arm in the position shown in FIGS. 22a-c and then adjusts the force adjustment screw 30 using a screwdriver or Allen (or hex) key 54 by trial and error until the torques are balanced and the monitor floats in all monitor height positions. The operative then reads off the indication setting of the first installed arm by noting the position of the spring nut plate 40 in the indicator window relative to the markings. The read and noted indicator settings can then be used as the initial setting for further similar installations. Further trial and error may be necessary to fine tune any such further installations.

Figure 12B:
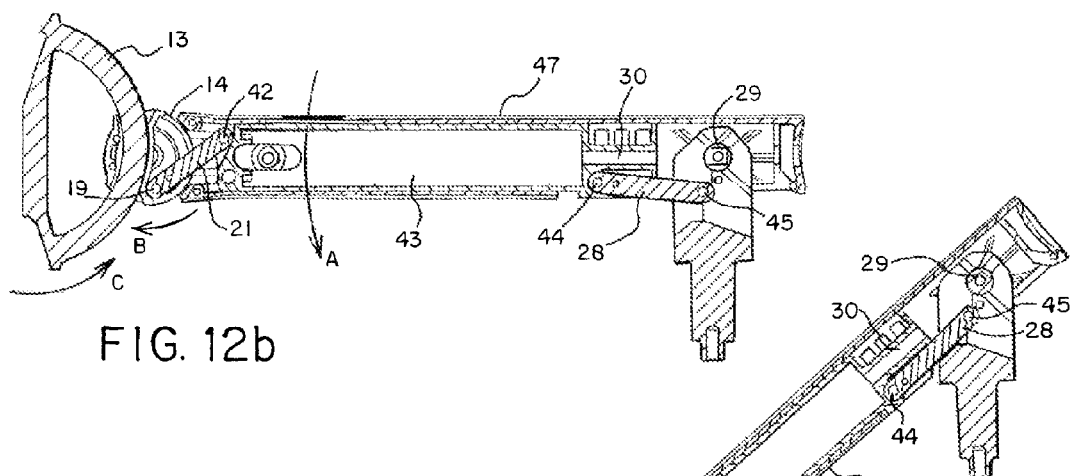
Figure 12C:
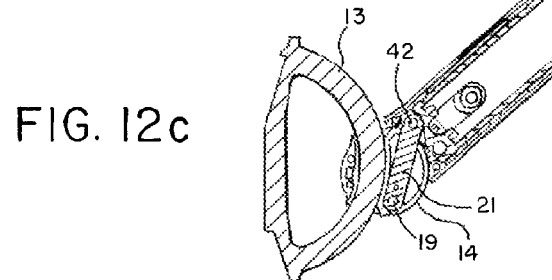
Figure 21A:
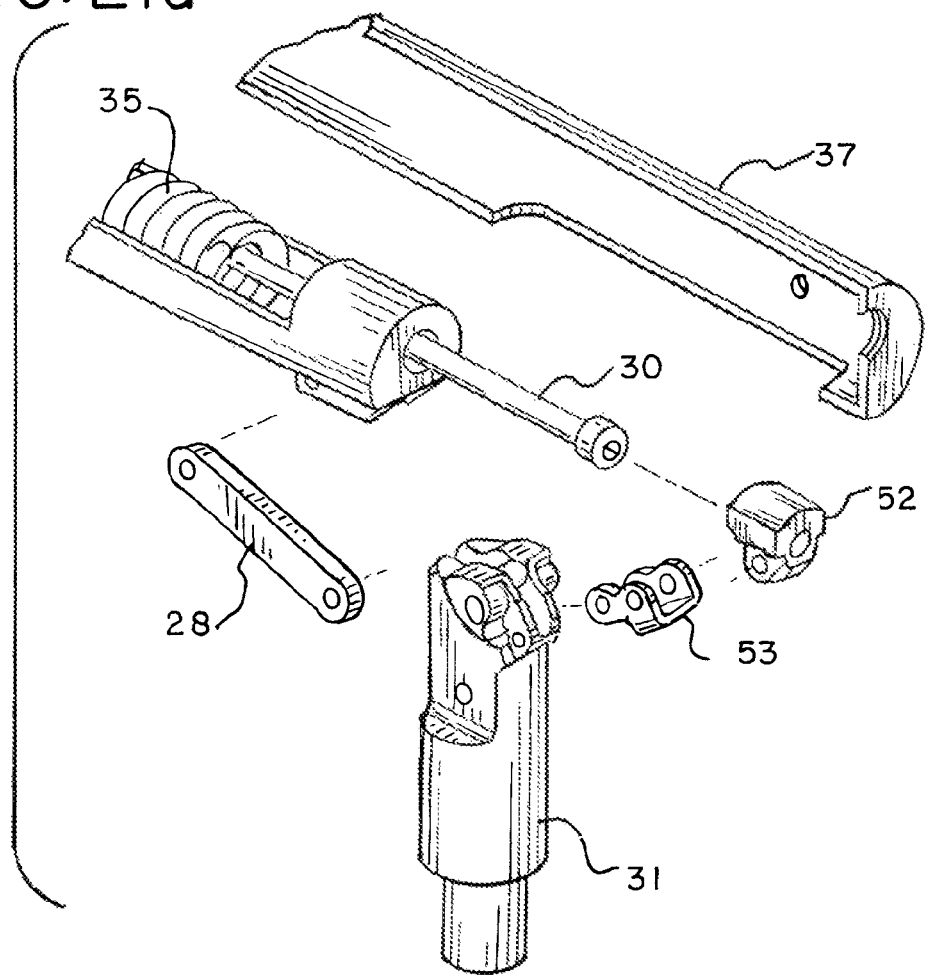
FIGS. 21a and 21b illustrate a detail at the bottom end of the upper support arm in an alternative embodiment of the invention.
Figure 21B:
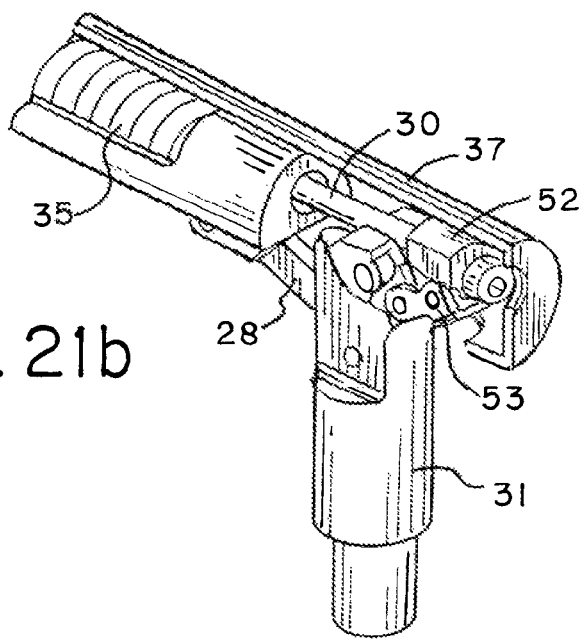

Referring to FIGS. 12a-c, the rear power link 28 is arranged between the proximal end of the spring slider 43 and the mid-joint 31 so as to transmit the force from the compression spring 35 to the mid-joint 31. The rear power link 28 is connected to the spring slider 43 at the rear power link's distal end by a distal rear link pivot pin 44, defining a distal force transmission link pivot, held between the two moulding halves 25, 34 of the spring slider 43 and is connected to the mid-joint 31 by a proximal rear link pivot pin 45, defining a proximal force transmission link pivot, held between two upstanding portions 46 of the U-shaped mid-joint 31. The rear power link proximal pivot 45 is located on the mid-joint below the upper arm pivot point 29 and at a position forward or distal from the vertical axis passing through that support arm pivot point 29.

As will be discussed in more detail below, the combination of the support arm outer casing 47 pivotally coupled at its proximal end to the mid-joint 31 and at its distal end to the motion joint 14, combined with the internal slider 43 coupled at its distal end via the front link 21 and at its proximal end via the rear power link 28 means that a monitor supported on the mounting head remains in substantially the same plane as the upper support arm 4 pivots about the mid-joint 31 in the manner shown in FIGS. 12a, 12b and 12c.

Referring to FIGS. 12a to 12c, as the upper support arm pivots about the mid-joint pivot pin in direction A from, for example, the position shown in FIG. 12a to the position shown in FIG. 12b (or, for example, the position shown in FIG. 12b to the position in FIG. 12c), the rear power link 28 pushes the slider 43 in the support arm casing 47 towards the motion joint 14. This then causes the front link 21 to push its pivot point on the motion joint forward. As the distal front link pivot pin 19 is located on the motion joint 14 at a point below the pivot or axis of rotation X''' between the motion joint 14 and the support arm outer casing 47, this causes the motion joint 14 to rotate in direction B relative to the support arm casing 47 and thereby reduce or prevent tilting of the monitor relative to its original plane. If there were no movement of the motion joint in direction B relative to the support casing, a monitor held on the mounting head would tilt in direction C as the support arm was rotated in direction A.

As shown in, for example, FIGS. 1, 12a, 12b and 12c, in order to raise and/or lower a monitor (not shown) fixed to the mounting head 14 relative to the lower arm 3 and hence the table surface on which the support device 1 is mounted, the upper support arm 4 can be rotated from its highest position (see FIG. 12a), approximately 45 degrees above the horizontal down to its lowest position (see FIG. 11c), approximately 45 degrees below the horizontal. The spring 35 inside the support arm 4 acts on the mid-joint 31 via the rear link 28 to produce a torque which counter-acts the torque produced by the weight of the monitor. The maximum distance and hence torque is when the arm is horizontal (see FIGS. 12b and 13b) and at its minimum when in its uppermost (see FIGS. 12a and 13a) and lowermost (see FIGS. 12c and 13c) positions.

As can be seen from FIG. 13, the distance of the monitor from its centre of gravity to the mid-joint pivot P, is at its greatest when the upper support arm is horizontal (FIG. 13b) and lowest when the monitor is in either its uppermost (FIG. 13a) or lowermost (FIG. 13c) positions.

This means that (as shown in FIG. 14) the torque at the mid joint pivot 29 (P in FIGS. 13 and 14) created by the monitor weight is at a maximum when the arm angle to the horizontal is 0° and at a minimum at the ends of its range of movement which are +45° and −45° in the illustrated example. The graph of FIG. 14 is an illustration of the magnitude of the torque at P (i.e. pivot point 29) created by a monitor weight which assumes a monitor weight of 40N, an arm length of 265 mm and a range of movement of +/−45° from the horizontal.

The known arrangements (see FIG. 15) for opposing the torque created at the pivot point 29 by the load at the distal end of the support arm use a spring force G created by either a mechanical spring or gas spring inside the upper support arm 4. This spring force G is transmitted via a rear power link 151 of length f which acts through proximal rear link pivot point 152 at a distance d vertically below the main support arm pivot point P (or 29). The torque T at P generated by the spring force G is the product of the force S in the rear link 151 and the distance d. Force S is equal to the component of spring force G along the direction of the rear power link.

Referring to FIG. 16, if the spring force G is constant and the range of movement of the support arm is +/−45° from the horizontal, then the variation in T is as shown in FIG. 15 by the constant force line 65. The torque T varies as the support arm pivots because the component of the spring force G along the direction of the rear power link 151 varies as this pivots relative to the upper support and the direction of the spring force G. As can be seen in FIG. 16, the torque created by the constant spring force in the known arrangement of FIG. 14 does not vary in the same way as the torque created by the weight of the load W (line 66 in graph). In particular, the peak weight opposing torque 62 (i.e. the torque produced by the spring force G) is not at the same position as the peak torque created by the load weight. Furthermore, if the spring force is created by a mechanical spring such as a compression spring, the differences are even greater (see FIG. 16 wherein the variation in torque from a compression spring is line 67)). This is because the magnitude of the spring force G varies as the spring is compressed to varying degrees as the upper support arm rotates.

In the embodiment of the invention shown in FIGS. 1 to 11 and 17, the torque produced by the weight of the monitor (see FIGS. 18 and 19) is opposed by a torque which is the product of the spring force created by the compression spring 35 in the rear power link 28 and the perpendicular distance e between the line of that force and the proximal power link pivot 45.

As shown in FIGS. 18a to 18c, the proximal rear power link pivot pin 44 of the described embodiment of the invention is located forward (or distal) from the axis W (see FIG. 18b) through the mid-joint pivot 29 which is orthogonal to the longitudinal axis of the upper support arm at the mid point of range of movement of the upper support arm; i.e. the proximal rear link pivot 44 is forward of a vertical axis through the mid-joint pivot 29 when the upper support arm can move between +/−45° to the horizontal.

As illustrated in FIGS. 19 and 20 where line 68 illustrates the variation in torque created about the pivot pin 29 by the compression spring 35 acting via the rear power link 28, this position of the proximal rear power link pivot pin 4 moves the peak torque about mid-joint pivot 29 created by the spring 35 acting through the rear power link 28. Careful selection of the geometry and/or dimensions of the element (and their relative geometry and dimensions) making up the proximal end of the upper support arm 4 (including the rear link 28; pivots 29, 44, 45), the spring properties and the load weight allow one to move the position of peak opposing torque 64 (see FIG. 20) to a position closer to the position of the peak load weight torque of line 66.

The placing of the proximal pivot 45 for the rear link at a position forward or distal from the vertical was through the proximal support arm pivot 29 (i.e. forward or distal from an axis through the pivot 29 and orthogonal to the support arm longitudinal axis at the mid-point of the range of movement of the support arm about axis X" (i.e. position shown in FIG. 12b) means that the perpendicular distance d varies in a manner which is closer to the variation in the torque caused by the weight of the monitor than is the case in the known arrangements which have the rear link pivot point in line with a vertical line through the proximal support arm pivot (where the mid-point of the range of movement is the horizontal). In the described embodiment, the mid-point of the range of movement of the support arm about axis X" is the horizontal so that the relevant axis through the pivot 29 is vertical. However, in alternative embodiments with a different range of movement, the relevant axis through the proximal pivot support arm 29 might not be vertical.

Referring to FIGS. 18a to 18c, as the support arm 4 rotates from its uppermost position (see FIG. 18a), through the mid-position (see FIG. 18b) down to its lowermost position (18c), the rear power link 28 progressively compresses the spring 35 by pushing it against the fixed spring nut plate 40. This means that the force provided by the spring 35 progressively increases as the support arm 4 is lowered in a manner similar to that discussed above in connection with FIG. 17.

In an alternative embodiment of the invention illustrated in FIGS. 21a, 21b and 22a to 22c, the increasing spring force which results as the spring 35 is compressed as illustrated in FIGS. 18a to 18c as the support arm moves from its uppermost (see FIG. 22a) to is lowermost (see FIG. 22c) position and progressively compresses the spring 35 further, is modified or controlled by modifying or controlling the degree of compression of the spring inside the support arm 4 so as to optimise or improve the spring load relative to the variations in the torque created by the monitor weight as the support arm moves through its range of movement about the horizontal axis X".

In the alternative embodiment of FIGS. 21 and 22, the force adjusting screw 30 is held by a screw holding element 52 rather than then end of the support arm casing as in the embodiment of FIGS. 1 to 12 and 18. This screw holding element 52 is connected to the mid-joint 31 by a spring adjustment link 53, or compensation link, which is itself connected at its ends to the mid joint and screw holding element by pivot pins 54, defining compensation link distal and proximal pivots.

As the upper support arm 4 moves from its uppermost position (FIG. 22a) through the horizontal position (FIG. 22b) and onto its lowermost position (FIG. 22c), the pivoting action in direction E causes the spring link to pivot in direction F. This pivoting of the spring adjustment link 544 then moves the force adjustment screw 30 towards the distal end of the support arm in direction G and hence moves the spring nut plate 40 away from the proximal end of the spring 35. This movement therefore reduces the degree of compression of the spring 35 and hence the spring force as the support arm is rotated from its uppermost to its lowermost position.

Although the present invention has been described with reference to preferred embodiments, those skilled in the art will recognize that changes may be made in form and detail without departing form the spirit and scope of the invention. As such, it is intended that the foregoing detailed description be regarded as illustrative rather than limiting and that is the appended claims, including all equivalents thereof, which are intended to define the scope of the invention.

What is claimed is:

1. A mounting system for pivotally mounting the display to a support arm, the mounting system comprising:
   a device mounting element for supporting a display;
   a hoop element defined by a portion of the circumference of a circle and having opposite end portions coupled to the device mounting element;
   a support arm mount coupled to and slidable along a length of the hoop element wherein the support arm mount is rotatable about a first axis of the hoop element as the support arm slides relative to the hoop element, and wherein the support arm mount is rotatably mounted to the hoop element, wherein the support arm mount is rotatable relative to the hoop element about a second axis perpendicular to the first axis, wherein the second axis extends through the hoop element at a location where the support arm mount and the hoop element are coupled, and wherein a surface of the hoop element has a same shape as a bearing surface of the support arm mount, and wherein the support arm mount has an internal passage therethrough, a surface of the internal passage defining the bearing surface of the support arm mount; and
   wherein the support arm has a first end pivotally connected to the support arm mount and a second end pivotally connected to a base element, wherein the base element comprises a lower arm assembly coupled to the support arm, the lower arm assembly comprising a furniture securing element.

2. The mounting system of claim 1 wherein the first and second axes correspond to generally horizontal and vertical axes respectively.

3. The mounting system of claim 1 wherein the support arm mount comprises two halves cooperating to define the internal passage for the hoop element.

4. The mounting system of claim 3 wherein the two halves are releasably connected to each other, the two halves releasable from an engaged configuration wherein the two halves are connected to a disengaged configuration wherein the two halves are separated.

5. A mounting system for pivotally mounting the display to a support arm, the mounting system comprising:
- a device mounting element for supporting a display;
- a hoop element defined by a portion of the circumference of a circle and having opposite end portions coupled to the device mounting element, wherein the circle, of which the hoop element forms a portion of the circumference, has its centre at or near the centre of gravity of a display device mounted on the mounting system;
- a support arm mount coupled to and slidable along a length of the hoop element wherein the support arm mount is rotatable about a first axis of the hoop element as the support arm slides relative to the hoop element, and wherein the support arm mount is rotatably mounted to the hoop element, wherein the support arm mount is rotatable relative to the hoop element about a second axis perpendicular to the first axis, wherein the second axis extends through the hoop element at a location where the support arm mount and the hoop element are coupled; and
- wherein the support arm has a first end pivotally connected to the support arm mount and a second end pivotally connected to a base element, wherein the base element comprises a lower arm assembly coupled to the support arm, the lower arm assembly comprising a furniture securing element.

6. A mounting system for pivotally mounting the display to a support arm, the mounting system comprising:
- a device mounting element for supporting a display;
- a hoop element defined by a portion of the circumference of a circle and having opposite end portions coupled to the device mounting element, wherein the hoop element has a substantially circular cross-section;
- a support arm mount coupled to and slidable along a length of the hoop element wherein the support arm mount is rotatable about a first axis of the hoop element as the support arm slides relative to the hoop element, and wherein the support arm mount is rotatably mounted to the hoop element, wherein the support arm mount is rotatable relative to the hoop element about a second axis perpendicular to the first axis, wherein the second axis extends through the hoop element at a location where the support arm mount and the hoop element are coupled; and
- wherein the support arm has a first end pivotally connected to the support arm mount and a second end pivotally connected to a base element wherein the base element comprises a lower arm assembly coupled to the support arm, the lower arm assembly comprising a furniture securing element.

7. A mounting system for pivotally mounting the display to a support arm, the mounting system comprising:
- a device mounting element for supporting a display;
- a hoop element defined by a portion of the circumference of a circle; and
- a support arm mount coupled to and slidable along a length of the hoop element wherein the support arm mount is rotatable about a first axis of the hoop element as the support arm slides relative to the hoop element, and wherein the support arm mount is rotatably mounted to the hoop element, wherein the support arm mount is rotatable relative to the hoop element about a second axis perpendicular to the first axis, wherein the second axis extends through the hoop element at a location where the support arm mount and the hoop element are coupled;
- wherein the support arm is pivotally connected to the support arm mount, and wherein the support arm comprises:
- a proximal support arm pivot coupling a proximal portion of the support arm to a base element;
- a distal support arm pivot coupling a distal portion of the support arm to the support arm mount;
- a slider element moveable parallel to the longitudinal axis of the support arm;
- a proximal slider link between and pivotally connected to a proximal portion of the slider element and the base element, the proximal slider link including a proximal pivot coupling the proximal slider link to the base element;
- a distal slider link between and pivotally connected to a distal portion of the slider element and the support arm mount, the distal slider link including a distal pivot coupling the distal slider link to the support arm mount, wherein the proximal pivot and the distal pivot are both respectively positioned either above or below the proximal and distal support arm pivots.

8. A mounting system according to claim 7 wherein the slider element is disposed within the support arm.

9. A mounting system according to claim 7 wherein the slider element is disposed adjacent the support arm.

10. A mounting system according to claim 7 wherein the proximal pivot and the distal pivot are both respectively positioned below the proximal and distal support arm pivots.

11. A mounting system for pivotally mounting a display to a support arm, the mounting system comprising:
- a device mounting element for supporting the display;
- a hoop element defined by a portion of the circumference of a circle; and
- a support arm mount coupled to and slidable along a length of the hoop element wherein the support arm mount is rotatable about a first axis of the hoop element as the support arm slides relative to the hoop element, and wherein the support arm mount is rotatably mounted to the hoop element, wherein the support arm mount is rotatable relative to the hoop element about a second axis perpendicular to the first axis, wherein the second axis extends through the hoop element at a location where the support arm mount and the hoop element are coupled;
- wherein the support arm is pivotally connected to the support arm mount, and wherein the support arm includes:
- a proximal support arm pivot coupling a proximal portion of the support arm to a base element;
- a force transmission member link for providing a torque about the proximal support arm pivot to oppose the torque about the proximal support arm pivot arising from the display on the device mounting element,
- a slider element within the support arm;
- a force generating member within the slider element and acting against a proximal end of the slider element;
- wherein the force transmission member link is between, and pivotally connected to the slider element and base element at, respectively, distal and proximal portions of the force transmission member link, the force transmission member link including:
- a proximal force transmission link pivot coupling the proximal portion of the force transmission member link to the base element and a distal force transmission link pivot coupling the distal portion of the force transmission member link to the slider element at a position between the proximal and distal portions of the support arm,
- and wherein the proximal force transmission link pivot is positioned forwardly of a line through the proximal support arm pivot and substantially orthogonal to the longitudinal axis of the support arm when the support arm is at the mid-point of its range of movement about the proximal support arm pivot in a direction towards the distal end of the support arm.

12. A mounting system according to claim 11 wherein the longitudinal axis of the support arm is substantially horizontal at the mid-point of the range of movement of the support arm.

13. A mounting system according to claim 11 wherein the force generating member comprises a spring for applying a force to the distal end of the force transmission link.

14. A mounting system according to claim 13 wherein the spring is a compression spring.

15. A mounting system for pivotally mounting a display to a support arm, the mounting system comprising:
   a device mounting element for supporting the display;
   a hoop element defined by a portion of the circumference of a circle; and
   a support arm mount coupled to and slidable along a length of the hoop element wherein the support arm mount is rotatable about a first axis of the hoop element as the support arm slides relative to the hoop element, and wherein the support arm mount is rotatably mounted to the hoop element, wherein the support arm mount is rotatable relative to the hoop element about a second axis perpendicular to the first axis, wherein the second axis extends through the hoop element at a location where the support arm mount and the hoop element are coupled;
   wherein the support arm is pivotally connected to the support arm mount, and wherein the support arm includes:
   a proximal support arm pivot coupling a proximal portion of the support arm to a base element;
   a spring inside the support arm for providing a force to at least partially support the weight of the display on the device mounting element, a first end of the spring acting upon a force transmission member through a slider element to create a torque about the proximal support arm pivot to oppose the torque created by the weight of the display on the device mounting element, a second end of the spring being supported on or by a moveable spring surface, the spring surface moving relative to the support arm as the support arm pivots about the proximal support arm pivot.

16. A mounting system according to claim 15 wherein the spring is a compression spring.

17. A mounting system according to claim 16 including a spring surface support element connected at a distal end to the moveable spring surface and pivotally connected at a proximal end to a compensation link.

18. A mounting system according to claim 17 wherein the spring surface support element is a rod extending through the compression spring and the moveable spring surface is a plate connected to the distal end or a distal portion of the rod.

19. A mounting system for pivotally mounting a display to a support arm, the mounting system comprising:
   a device mounting element for supporting the display;
   a hoop element defined by a portion of the circumference of a circle; and
   a support arm mount slidable along a length of the hoop element, and wherein the support arm mount is rotatably mounted to the hoop element;
   the support arm pivotally connected to the support arm mount, the support arm comprising:
   a proximal support arm pivot coupling a proximal portion of the support arm to a base element;
   a spring inside the support arm for providing a force to at least partially support the weight of the display on the device mounting element, a first end of the spring acting through a slider element upon a force transmission member to create a torque about the proximal support arm pivot to oppose the torque created by the weight of the display on the device mounting element, a second end of the spring being supported on or by a moveable spring surface, the moveable spring surface moving relative to the support arm as the support arm pivots about the proximal support arm pivot; and
   wherein the force transmission member comprises a force transmission member link between, and pivotally connected to, the slider element and base element at, respectively distal and proximal portions of the force transmission member link, a proximal force transmission link pivot coupling the proximal portion of the force transmission member link to the base element and a distal force transmission link pivot coupling the distal portion of the force transmission member link to the slider element between the proximal portion and a distal portion of the support arm, and, further comprising a spring adjustment or compensation link coupling the base element to a rod extending through the spring within the support arm.

20. A mounting system for pivotally mounting a display to a support arm, the mounting system comprising:
   a device mounting element for supporting the display;
   a hoop element defined by a portion of the circumference of a circle; and
   a support arm mount slidable along a length of the hoop element, and wherein the support arm mount is rotatably mounted to the hoop element;
   the support arm pivotally connected to the support arm mount, the support arm comprising:
   a proximal support arm pivot coupling a proximal portion of the support arm to a base element;
   a spring inside the support arm for providing a force to at least partially support the weight of the display on the device mounting element, a first end of the spring acting through a slider element upon a force transmission member to create a torque about the proximal support arm pivot to oppose the torque created by the weight of the display on the device mounting element, a second end of the spring being supported on or by a moveable spring surface, the moveable spring surface moving relative to the support arm as the support arm pivots about the proximal support arm pivot, wherein the spring is a compression spring, and further comprising a spring surface support element connected at a distal end to the moveable spring surface and pivotally connected at a proximal end to a compensation link, wherein the proximal end of the spring surface support element extends past the proximal support arm pivot so that a proximal portion of the spring surface support element is located on a side of the proximal support arm pivot opposite the force transmission link and the compensation link is pivotally connected to the base element.

* * * * *